(12) United States Patent
Takamori

(10) Patent No.: US 7,696,752 B2
(45) Date of Patent: Apr. 13, 2010

(54) MAGNETIC RESONANCE IMAGING APPARATUS

(75) Inventor: Hiromitsu Takamori, Otawara (JP)

(73) Assignees: Kabushiki Kaisha Toshiba, Tokyo (JP); Toshiba Medical Systems Corporation, Otawara (JP)

( * ) Notice: Subject to any disclaimer, the term of this patent is extended or adjusted under 35 U.S.C. 154(b) by 267 days.

(21) Appl. No.: 11/775,439

(22) Filed: Jul. 10, 2007

(65) Prior Publication Data

US 2008/0015430 A1  Jan. 17, 2008

(30) Foreign Application Priority Data

Jul. 12, 2006  (JP)  ............................. 2006-191818
May 31, 2007  (JP)  ............................. 2007-145868

(51) Int. Cl.
*G01V 3/00* (2006.01)

(52) U.S. Cl. ...................................... 324/307; 324/318

(58) Field of Classification Search ......... 324/300–322; 600/407–435

See application file for complete search history.

(56) References Cited

U.S. PATENT DOCUMENTS

| | | | | |
|---|---|---|---|---|
| 6,946,836 | B2 * | 9/2005 | Kuhara | 324/307 |
| 7,190,164 | B2 * | 3/2007 | Kuhara | 324/309 |
| 7,336,076 | B2 * | 2/2008 | Kuhara | 324/318 |
| 7,423,428 | B2 * | 9/2008 | Kuhara | 324/307 |
| 7,570,056 | B2 * | 8/2009 | Nakabayashi et al. | 324/318 |

FOREIGN PATENT DOCUMENTS

| | | |
|---|---|---|
| JP | 63-82643 | 4/1988 |
| JP | 8-257013 | 10/1996 |

\* cited by examiner

*Primary Examiner*—Brij B Shrivastav
(74) *Attorney, Agent, or Firm*—Oblon, Spivak, McClelland, Maier & Neustadt, L.L.P.

(57) ABSTRACT

A magnetic resonance imaging apparatus has a static field magnet, gradient coils, a gantry including an opening and storing the static field magnet the gradient coils, a bed structure for advancing and retreating a table-top, on which an object can be placed, with respect to the opening, a lower coil formed by a radio frequency coil disposed below the table-top, and a movement control unit configured to control the lower coil to be movable.

10 Claims, 33 Drawing Sheets

MAGNETIC RESONANCE IMAGING APPARATUS

BACKGROUND OF THE INVENTION

1. Field of the Invention

The present invention relates to a magnetic resonance imaging apparatus which magnetically excites the nuclear spin of an object with a high-frequency (RF) signal having the Larmor frequency and reconstructs an image from a magnetic resonance signal generated along with the excitation.

2. Description of the Related Art

A medical imaging apparatus provides a large amount of information on a patient in the form of an image, and plays an important role in many medical practices including the diagnosis of a disease, the treatment, and the operation planning. Currently, major medical imaging apparatuses include an ultrasonic diagnostic apparatus, an X-ray CT (computerized tomography) apparatus, a magnetic resonance imaging (hereinafter referred to as MRI) apparatus, and a nuclear medicine diagnostic apparatus. In particular, the MRI apparatus can collect a high-quality contrast image of soft tissue, and occupies an important place in the medical imaging diagnosis.

The MRI apparatus is an apparatus which uses gradient coils to generate gradient magnetic fields in the directions of the X-axis, the Y-axis, and the Z-axis in the field of view for imaging a patient set inside a cylindrical static field magnet that generates a static field, and which transmits a high-frequency signal from an RF (radio frequency) coil to magnetically resonates the nuclear spin in the patient and reconstruct an image of the patient with the use of an NMR (nuclear magnetic resonance) signal generated by the excitation.

The MRI apparatuses of recent years include the one using a coil system which increases the moving distance of a table-top carrying thereon the patient and includes a plurality of coils under the table-top to thereby enable the imaging of a wide area.

FIG. 36 is a diagram illustrating a configuration of a conventional MRI apparatus.

A conventional MRI apparatus 70 is formed by a whole body coil 71 as an RF coil provided in the circumferential direction about the body axis of a patient P, an upper coil 72 as an RF coil provided above the patient P, a lower coil 74 as an RF coil provided under a table-top 73, on which the patient P is placed, and moved integrally with the table-top 73 in the direction of the Z-axis, and a bed structure 75 for advancing and retreating the table-top 73 in the direction of the Z-axis with respect to a cavity formed in a gantry.

Further, to improve the S/N (signal to noise) ratio when the region to be imaged is the head or a foot, a special RF coil for imaging a local site is employed as an RF coil having a chassis substantially fitting the outer shape of the region to be imaged so that the signal is received at a position as close to the body surface of the imaged region as possible. For example, a head coil 76 is attached to the head of the patient P, and a foot coil 77 is attached to a foot of the patient P.

According to the MRI apparatus 70, the NMR signal of each of the imaged regions received by the lower coil 74 is received by a receiver 79 via a received signal cable 78, and an image is generated on the basis of the received signal. The image generated by the MRI apparatus 70 is used for cancer screening and so forth.

However, the conventional MRI apparatus including the coil system enabling the imaging of a wide area entails the following disadvantages.

Firstly, in the imaging of the whole body, for example, the moving distance of the lower coil needs to be at least the sum of the height of the patient and the distance from the leading end to the center of the gantry. Thus, the received signal cable connected to the lower coil is increased in length. As a result, the S/N ratio of the signal received by the receiver is deteriorated.

Secondly, the patient needs to be positioned in accordance with the lower coil, and the positioning takes time. Further, the burden on the patient caused by the time taken for the positioning is large.

Thirdly, the coil on the table-top is displaced from the coil position optimized for each of the sites, depending on the physical size of the patient. As a result, good imaging is prevented.

Fourthly, since the coil is provided on the table-top, an extra coil set is required for a stretcher in which the patient is previously positioned on the table-top.

Fifthly, in the use of the special RF coil for imaging a local site, the RF coil is coupled with the coil provided on the table-top. As a result, the performance of the coils cannot be optimized.

SUMMARY OF THE INVENTION

The present invention has taken into consideration the above-described problems, and it is an object of the present invention to provide a magnetic resonance imaging apparatus, a positioning of an object becomes easy, it becomes easy to choose the most suitable coil, and can reduce a factor to obstruct performance of the coil.

To solve the above-described problems, the present invention provides the magnetic resonance imaging apparatus comprising: a static field magnet; gradient coils; a gantry including an opening and storing the static field magnet the gradient coils; a bed structure for advancing and retreating a table-top, on which an object can be placed, with respect to the opening; a lower coil formed by a radio frequency coil disposed below the table-top; and a movement control unit configured to control the lower coil to be movable.

DESCRIPTION OF THE PREFERRED EMBODIMENTS

Embodiments of a magnetic resonance imaging (hereinafter referred to as MRI) apparatus according to the present invention will be described with reference to the accompanying drawings.

First Embodiment

Figure 1:
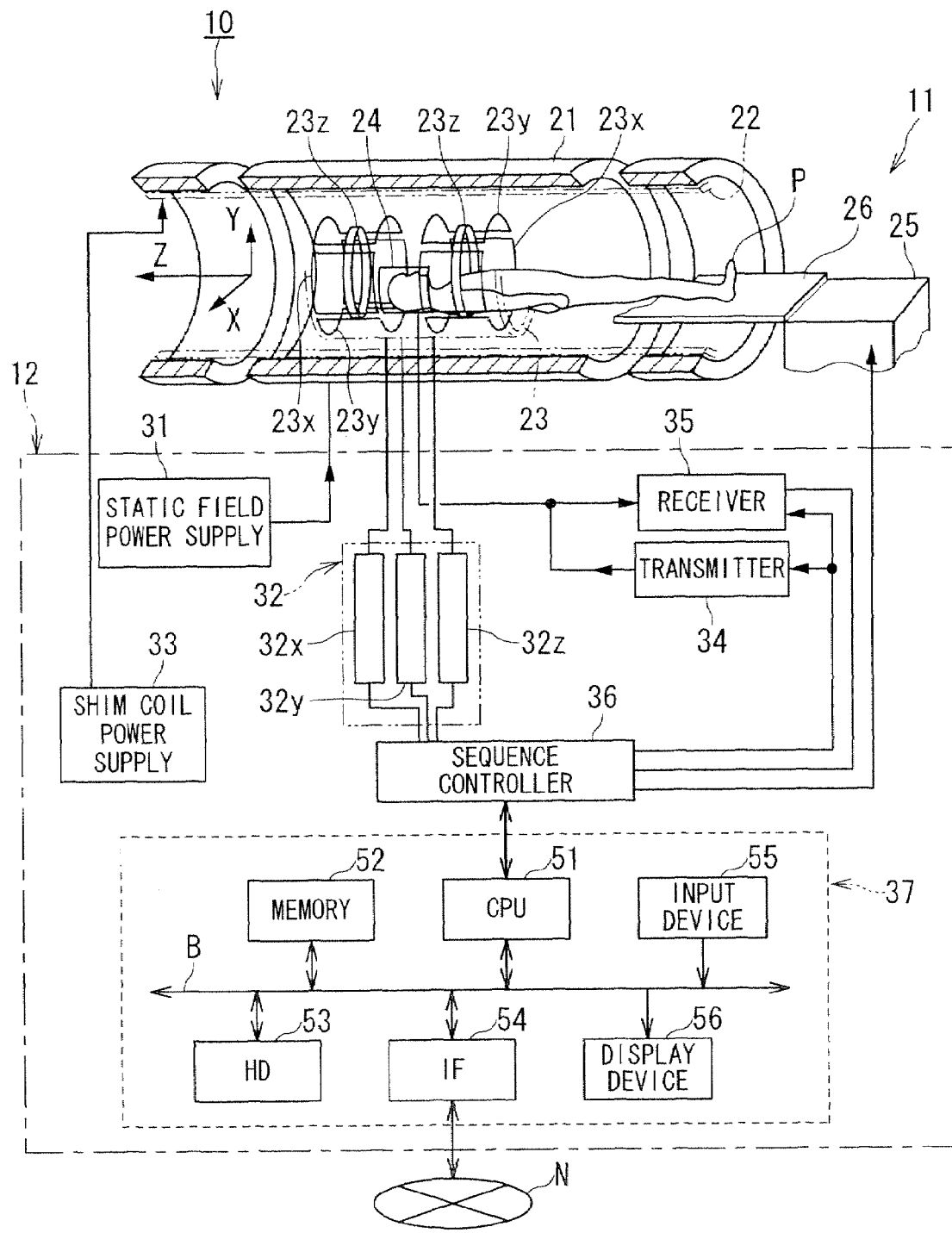
FIG. 1 is a schematic view illustrating a configuration of a first embodiment and a second embodiment of the MRI apparatus according to the present invention.

FIG. 1 is a schematic view illustrating a configuration of a first embodiment of the MRI apparatus according to the present invention.

FIG. 1 illustrates an MRI apparatus 10 according to the first embodiment, which images a patient (an object) P while continuously moving the patient P. The MRI apparatus 10 is mainly formed by an imaging system 11 and a controlling system 12.

The imaging system 11 of the MRI apparatus 10 is provided with a gantry (not illustrated). The gantry stores therein a static field magnet 21, a cylindrical shim coil 22 provided inside and coaxial with the static field magnet 21, and a gradient coil unit 23 formed into a cylindrical shape and provided inside the static field magnet 21. Further, the imaging system 11 is provided with an RF coil 24 for transmitting a high-frequency (RF: radio frequency) signal having the Larmor frequency (resonant frequency), and a bed structure 25 for advancing and retreating the patient P with respect to the inside of the gantry.

Meanwhile, the controlling system 12 of the MRI apparatus 10 has a static field power supply 31, a gradient magnetic field power supply 32, a shim coil power supply 33, a transmitter 34, a receiver 35, a sequence controller (a sequencer) 36, and a computer 37.

The static field magnet 21 is connected to the static field power supply 31. Current is supplied from the static field power supply 31 to generate a static field in the field of view (hereinafter referred to as the FOV).

The shim coil 22 is connected to the shim coil power supply 33. Current is supplied from the shim coil power supply 33 to the shim coil 22 to homogenize the static field.

The gradient coil unit 23 is formed by an X-axis gradient coil 23x, a Y-axis gradient coil 23y, and a Z-axis gradient coil 23z. Further, the inside of the gradient coil unit 23 is provided with a table-top 26 of the bed structure 25, and the patient P is placed on the table-top 26. The table-top 26 is moved by the bed structure 25.

The gradient coil unit 23 is connected to the gradient magnetic field power supply 32. The X-axis gradient coil 23x, the Y-axis gradient coil 23y, and the Z-axis gradient coil 23z of the gradient coil unit 23 are respectively connected to an X-axis gradient magnetic field power supply 32x, a Y-axis gradient magnetic field power supply 32y, and a Z-axis gradient magnetic field power supply 32z of the gradient magnetic field power supply 32.

Current is supplied from the X-axis gradient magnetic field power supply 32x, the Y-axis gradient magnetic field power supply 32y, and the Z-axis gradient magnetic field power supply 32z to the X-axis gradient coil 23x, the Y-axis gradient coil 23y, and the Z-axis gradient coil 23z, respectively. Thereby, the current generates in the FOV gradient magnetic fields Gx, Gy, and Gz, which are oriented in the directions of the X-axis, the Y-axis, and the Z-axis, respectively.

The RF coil 24 is formed by multiple coils, and is connected to the transmitter 34 and the receiver 35. The RF coil 24 has a function of receiving a high-frequency signal from the transmitter 34 and transmitting a high-frequency field pulse to the patient P, and a function of receiving the NMR signal generated along with the excitation by the high-frequency signal of the nuclear spin inside the patient P and supplying the NMR signal to the receiver 35. The transmission and reception system of the RF coil 24 is divided into a system of using a single coil as a transmitter coil and a receiver coil and a system of using separate coils as the transmitter coil and the receiver coil. The MRI apparatus 10 is provided with the RF coil 24. In addition, in FIG. 1, only a head coil is illustrated as an example of the RF coil 24.

Figure 2:
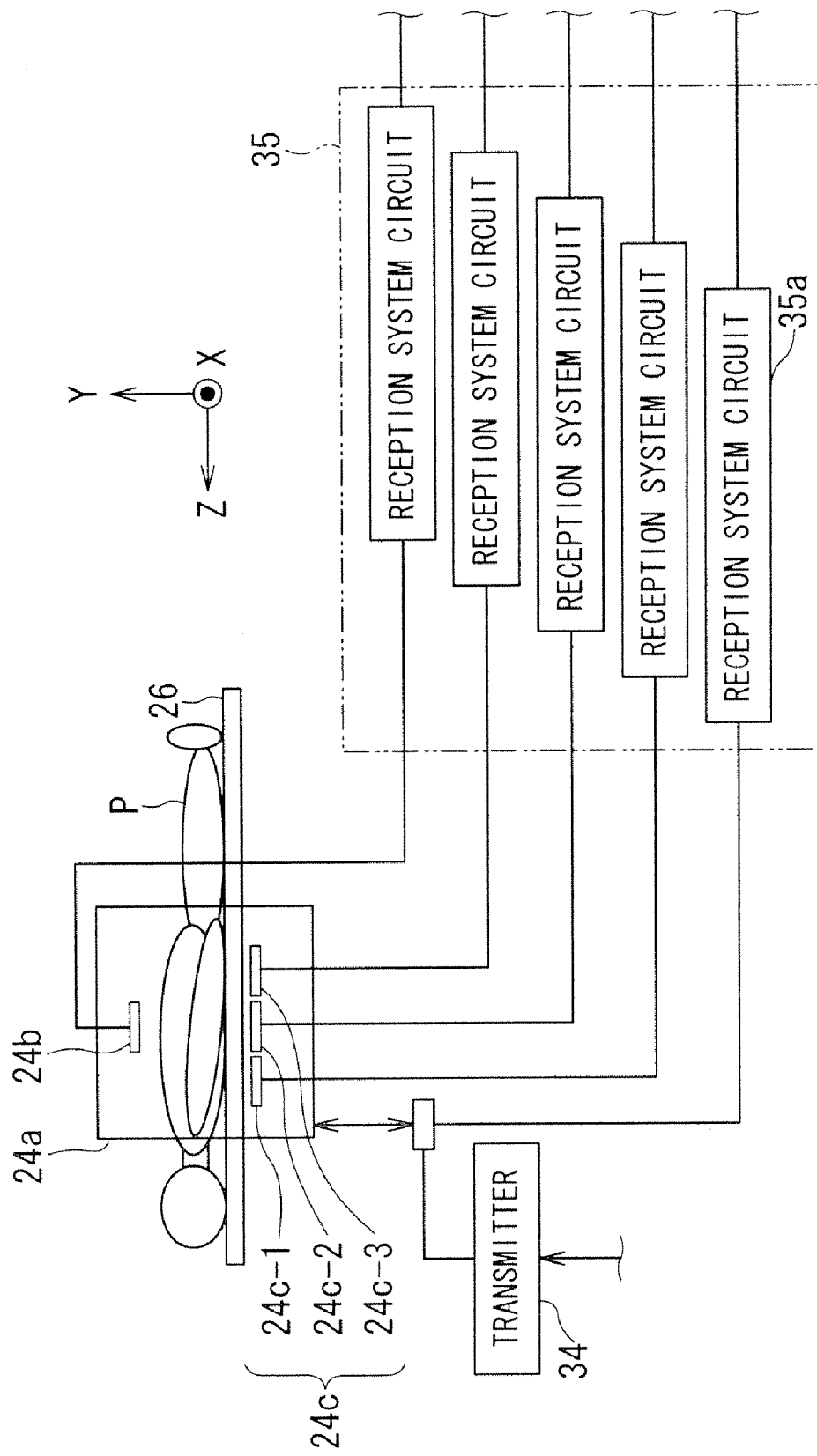
FIG. 2 is a diagram illustrating a first example of a relationship between a RF coil and a receiver.

FIG. 2 is a diagram illustrating a first example of the relationship between the RF coil 24 and the receiver 35.

As illustrated in FIG. 2, the MRI apparatus 10 is provided with a whole body (hereinafter referred to as WB) coil 24a serving as a transmission and reception RF coil, an upper (ceiling-side) coil 24b serving as a reception RF coil, and a lower (bottom-side) coil (a spine coil) 24c serving as a reception RF coil. The upper coil 24b is stored in the gantry, and is provided at a position in the imaging center of the gantry facing the lower coil 24c across the patient P. Meanwhile, the lower coil 24c is disposed below the table-top 26. The lower coil 24c is an assembly of a plurality of lower coil elements 24c-m (e.g., 24c-1, 24c-2, and 24c-3), and is also referred to as a phased array coil. The WB coil 24a, the upper coil 24b, and the respective lower coil elements 24c-m are individually connected to reception system circuits 35a.

Figure 3:
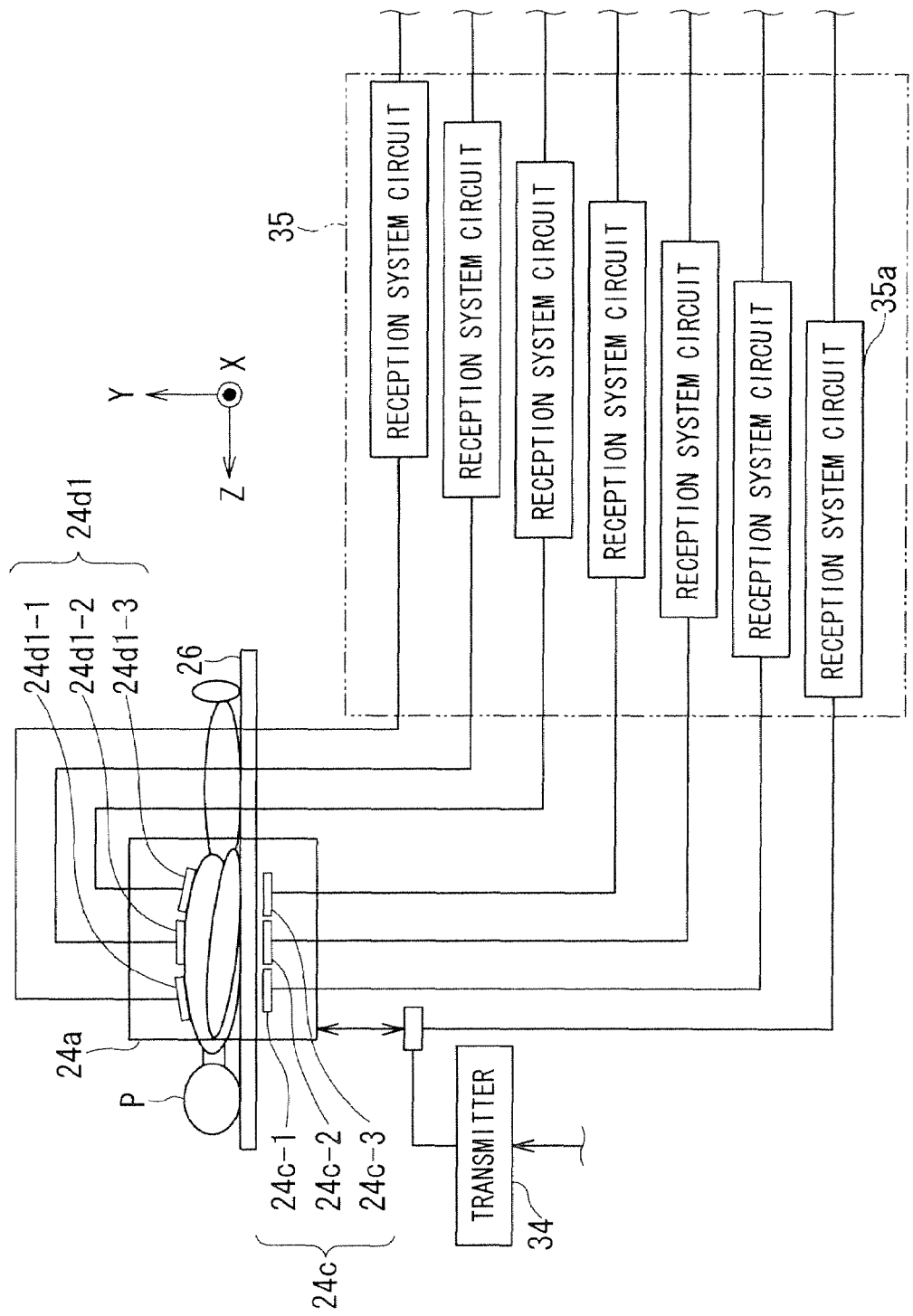
FIG. 3 is a diagram illustrating a second example of a relationship between the RF coil and the receiver.

FIG. 3 is a diagram illustrating a second example of the relationship between the RF coil 24 and the receiver 35.

The MRI apparatus 10 is provided with the WB coil 24a, the lower coil 24c, and a local site imaging coil 24d serving as a reception RF coil, such as a body coil (an abdomen coil) 24d1, for example. The body coil 24d1, which is placed on the body surface of the patient P, is an assembly of a plurality of body coil elements 24d1-n (e.g., 24d1-1, 24d1-2, and 24d1-3). The WB coil 24a, the respective body coil elements 24d1-n, and the respective lower coil elements 24c-m are individually connected to the reception system circuits 35a.

Figure 4:
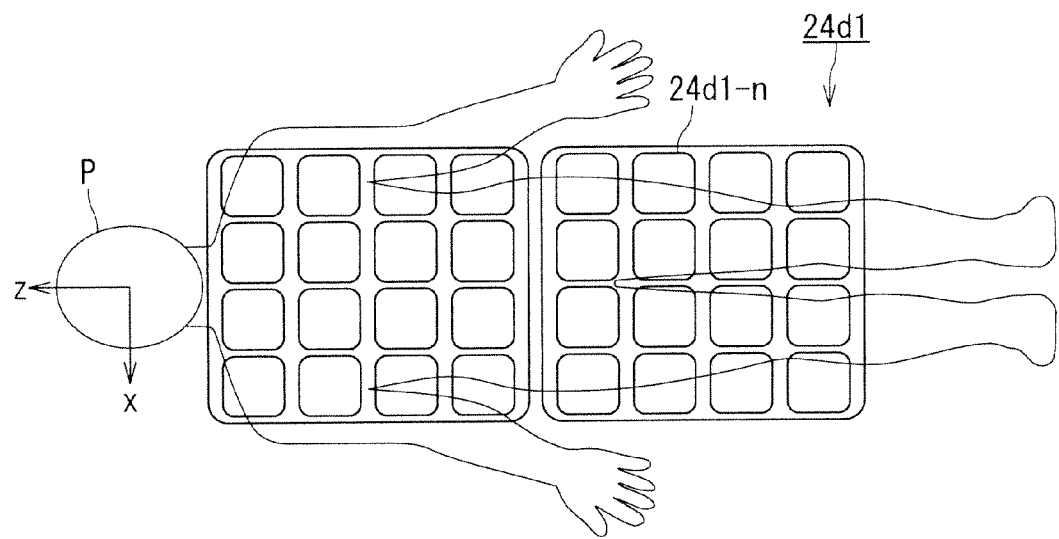
FIG. 4 is a top view illustrating arrangement examples of the body coil.
Figure 5:
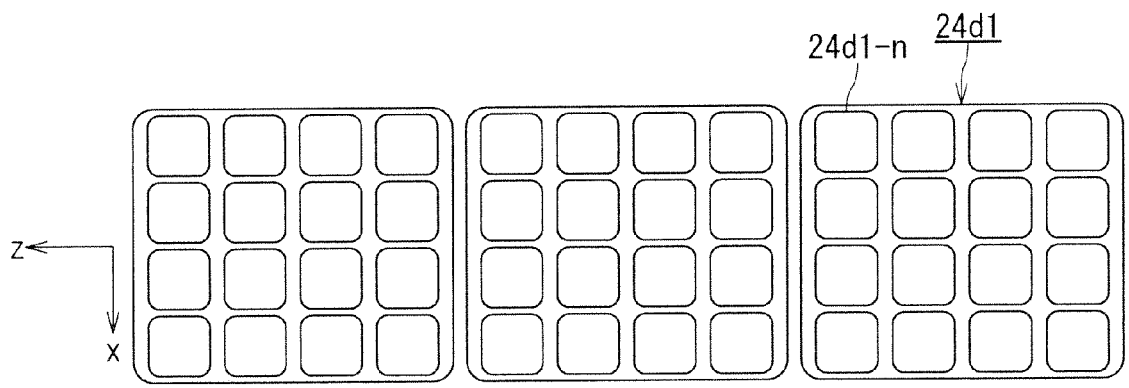
FIG. 5 is a top view illustrating arrangement examples of the body coil.

FIGS. 4 and 5 are top views illustrating arrangement examples of the body coil 24d1.

FIG. 4 illustrates an example in which two body coils 24d1 are arranged on the body surface of the patient P in the direction of the Z-axis to cover the region to be imaged. Each of the body coils 24d1 is provided with a total of sixteen body coil elements 24d1-n arranged in four columns in the direction of the X-axis and four columns in the direction of the Z-axis, for example. Meanwhile, FIG. 5 illustrates an example in which three body coils 24d1 are arranged on the body surface of the patient P in the direction of the Z-axis to cover a wide range of the region to be imaged.

Figure 6:
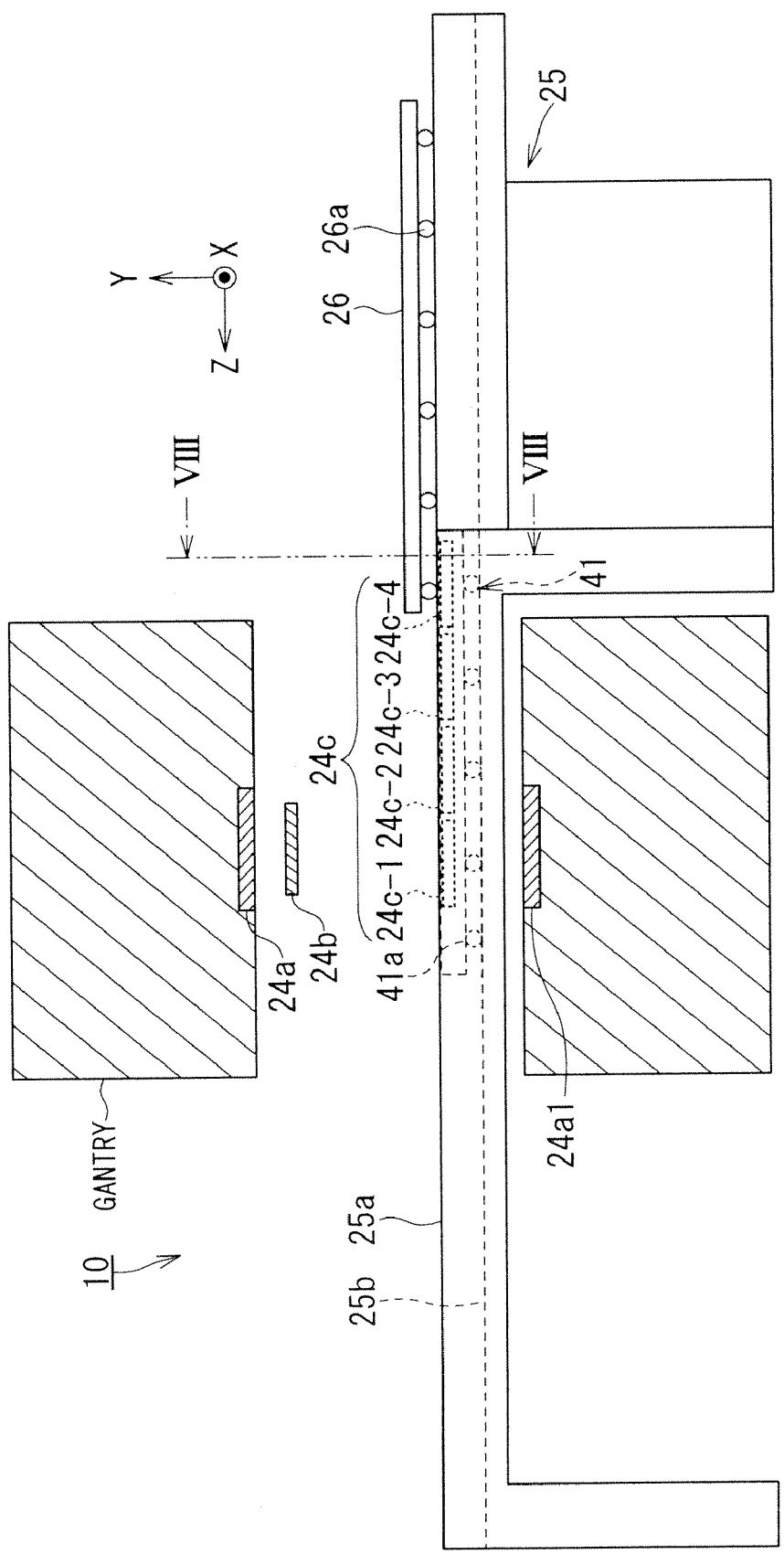
FIG. 6 is a cross-sectional view as viewed from a side, illustrating a positional relationship of a table-top and a lower coil and a movement control unit for controlling the movement of the lower coil in the direction of a Z-axis.
Figure 7:
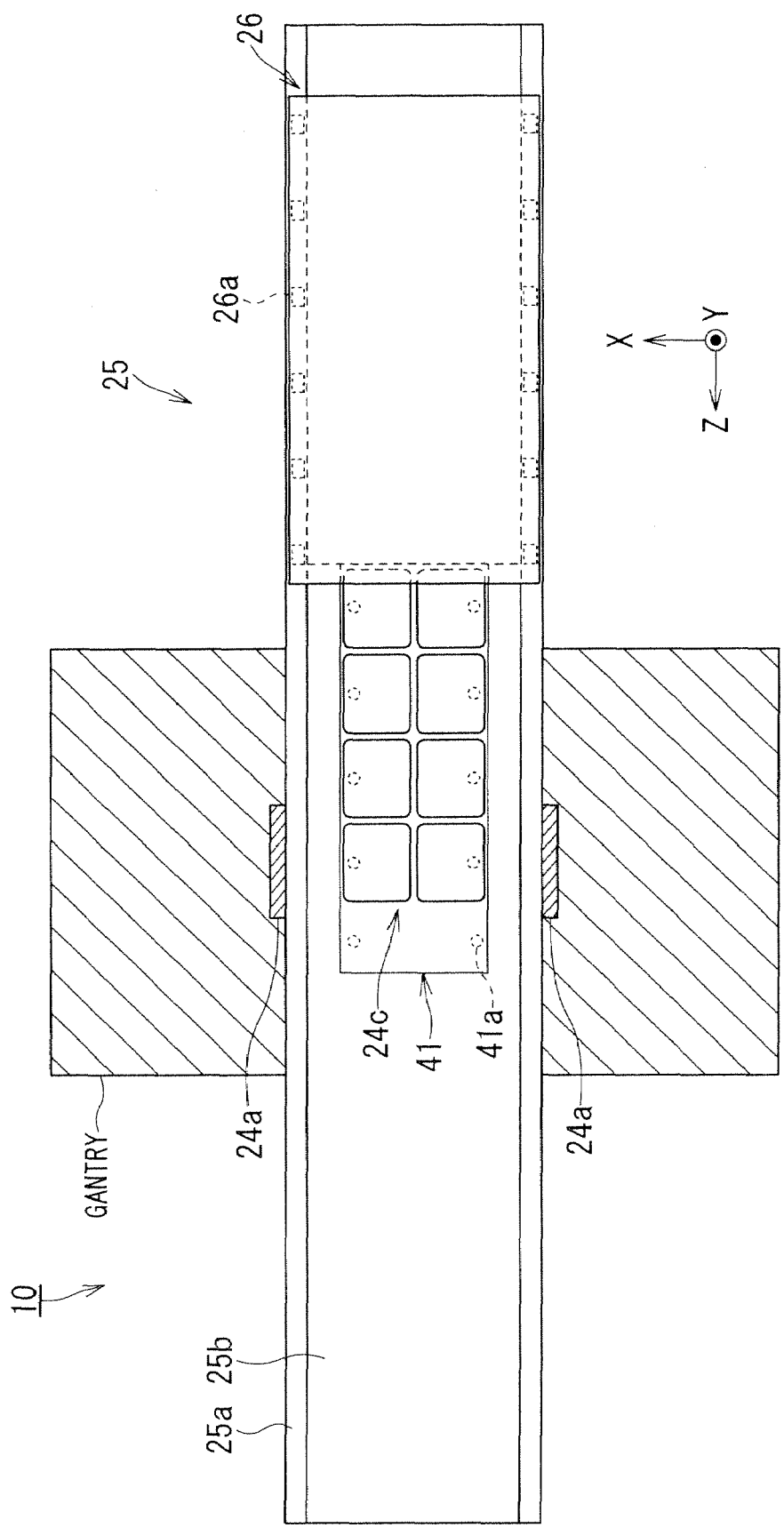
FIG. 7 is a cross-sectional view as viewed from above, similarly illustrating the positional relationship, and the movement control unit.
Figure 8:
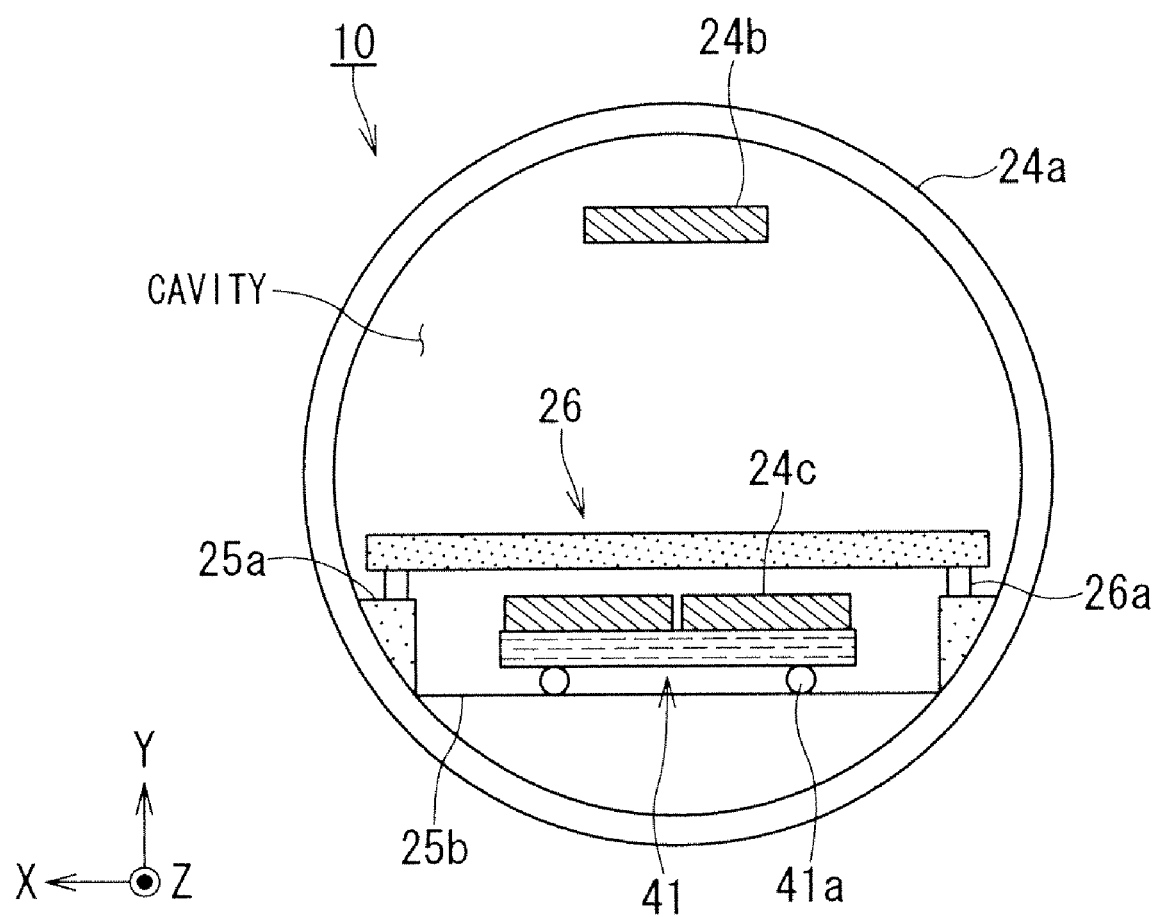
FIG. 8 is an arrow view along the VIII-VIII line, similarly illustrating the positional relationship, and the movement control unit.

FIG. 6 is a cross-sectional view as viewed from a side, illustrating the positional relationship of the table-top 26 and the lower coil 24c and a movement control unit for controlling the movement of the lower coil 24c in the direction of the Z-axis. FIG. 7 is a cross-sectional view as viewed from above, similarly illustrating the positional relationship and the movement control unit. FIG. 8 is an arrow view along the VIII-VIII line, similarly illustrating the positional relationship and the movement control unit. In FIGS. 6 to 20, description will be made by taking an example in which the RF coil 24 for imaging an upper part of the patient P is the upper coil 24b stored in the gantry (the first example illustrated in FIG. 2). However, the description similarly applies to an example in which the RF coil 24 for imaging an upper part of the patient P is the body coil 24d1 (the second example illustrated in FIG. 3).

The WB coil 24a of the MRI apparatus 10 is provided in the gantry about the body axis of the patient P in the circumferential direction. The upper coil 24b is provided in a cavity formed by the gantry. The lower coil 24c (the lower coil elements 24c-1, 24c-2, 24c-3, and 24c-4) is provided below the table-top 26. The table-top 26, on which the patient P is placed, is elevated or lowered in the direction of the Y-axis and advanced or retreated in the direction of the Z-axis by the bed structure 25.

A lower part of the table-top 26 of the bed structure 25 is provided with cylindrical table-top rollers 26a for advancing or retreating the table-top 26 in the direction of the Z-axis with respect to the cavity inside the gantry. As the table-top rollers 26a advance or retreat on a table-top roller moving path 25a, the table-top 26 is advanced or retreated in the direction of the Z-axis with respect to the cavity inside the gantry.

The MRI apparatus 10 is further provided with a movement control unit for controlling the lower coil 24c to be movable. For example, the lower coil 24c is mounted on a lower coil carriage 41, which serves as the movement control unit. A lower part of the lower coil carriage 41 is provided with spherical carriage rollers 41a for moving the lower coil carriage 41 in the gantry in the horizontal direction (in the direction of the X-Z plane). As the carriage rollers 41a move on a carriage roller moving path 25b, the lower coil carriage 41 is moved in the X-Z is moved in the direction of the X-Z plane. The lower coil carriage 41 mounted with the lower coil 24c moves under the table-top 26 without being prevented from moving by the advancing or retreating movement of the table-top 26.

Figure 9:
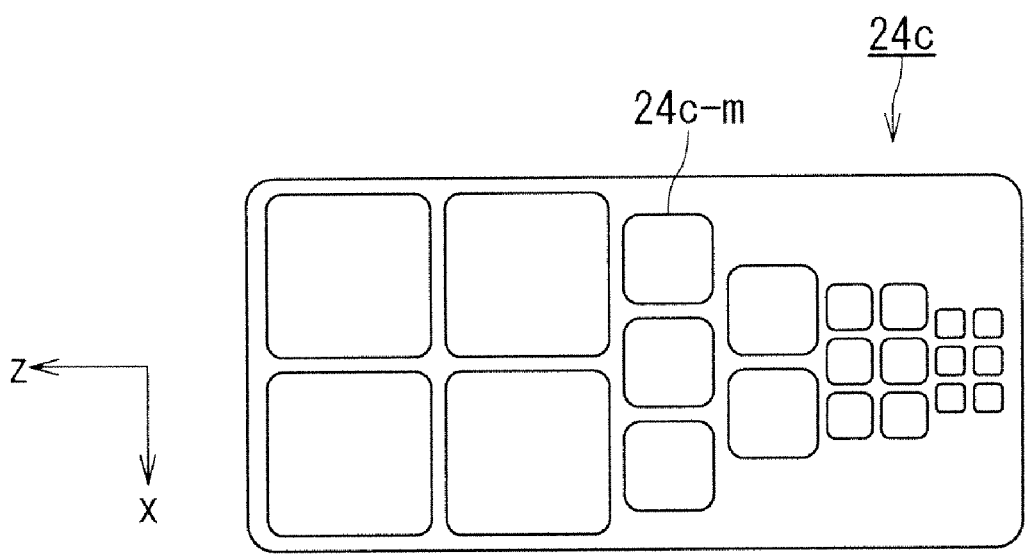
FIG. 9 is a top view illustrating other examples of the configuration of the lower coil.
Figure 10:
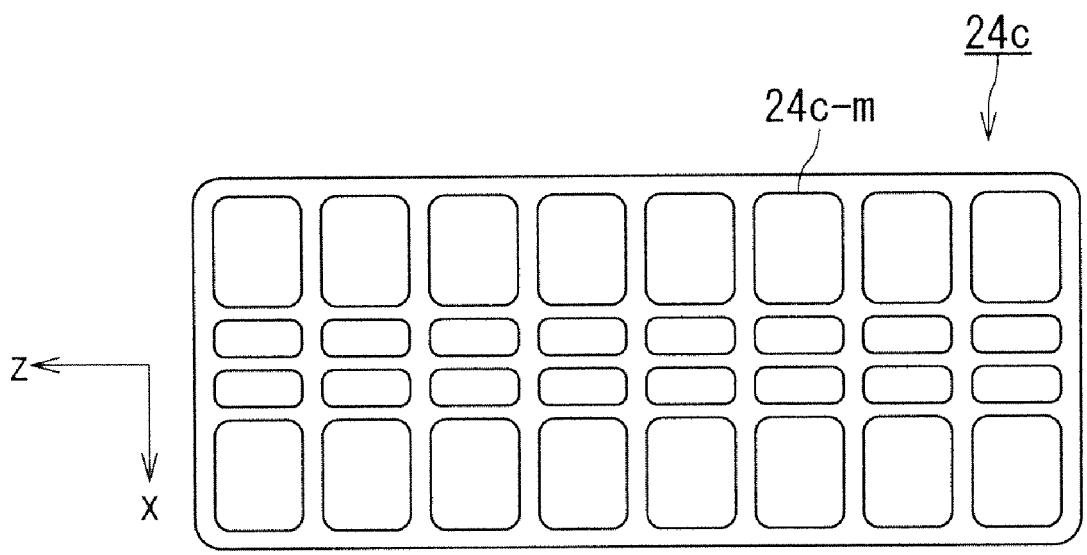
FIG. 10 is a top view illustrating other examples of the configuration of the lower coil.

FIGS. 9 and 10 are top views illustrating other examples of the configuration of the lower coil 24c.

As compared with the configuration of the lower coil 24c illustrated in FIG. 7, the number of channels is changed along the direction of the Z-axis in the configuration of the lower coil 24c illustrated in FIG. 9.

As compared with the configuration of the lower coil 24c illustrated in FIG. 7, the lower coil elements 24c-m located at positions corresponding to the spine of the patient P are arranged in smaller segments in the configuration of the lower coil 24c illustrated in FIG. 10.

Figure 11:
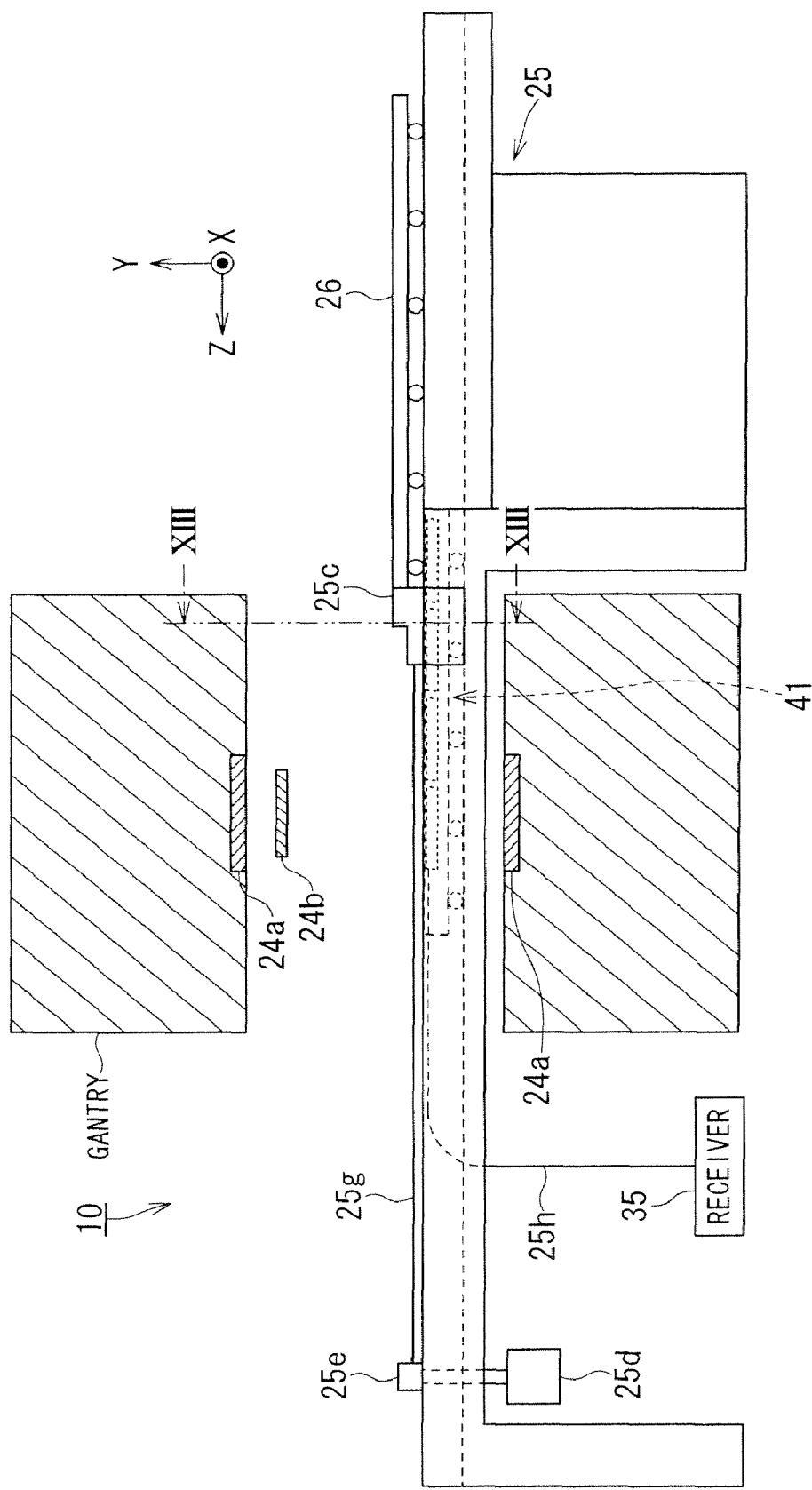
FIG. 11 is a cross-sectional view as viewed from a side, illustrating a configuration of a bed structure and a positional relationship of the bed structure and a lower coil carriage.
Figure 12:
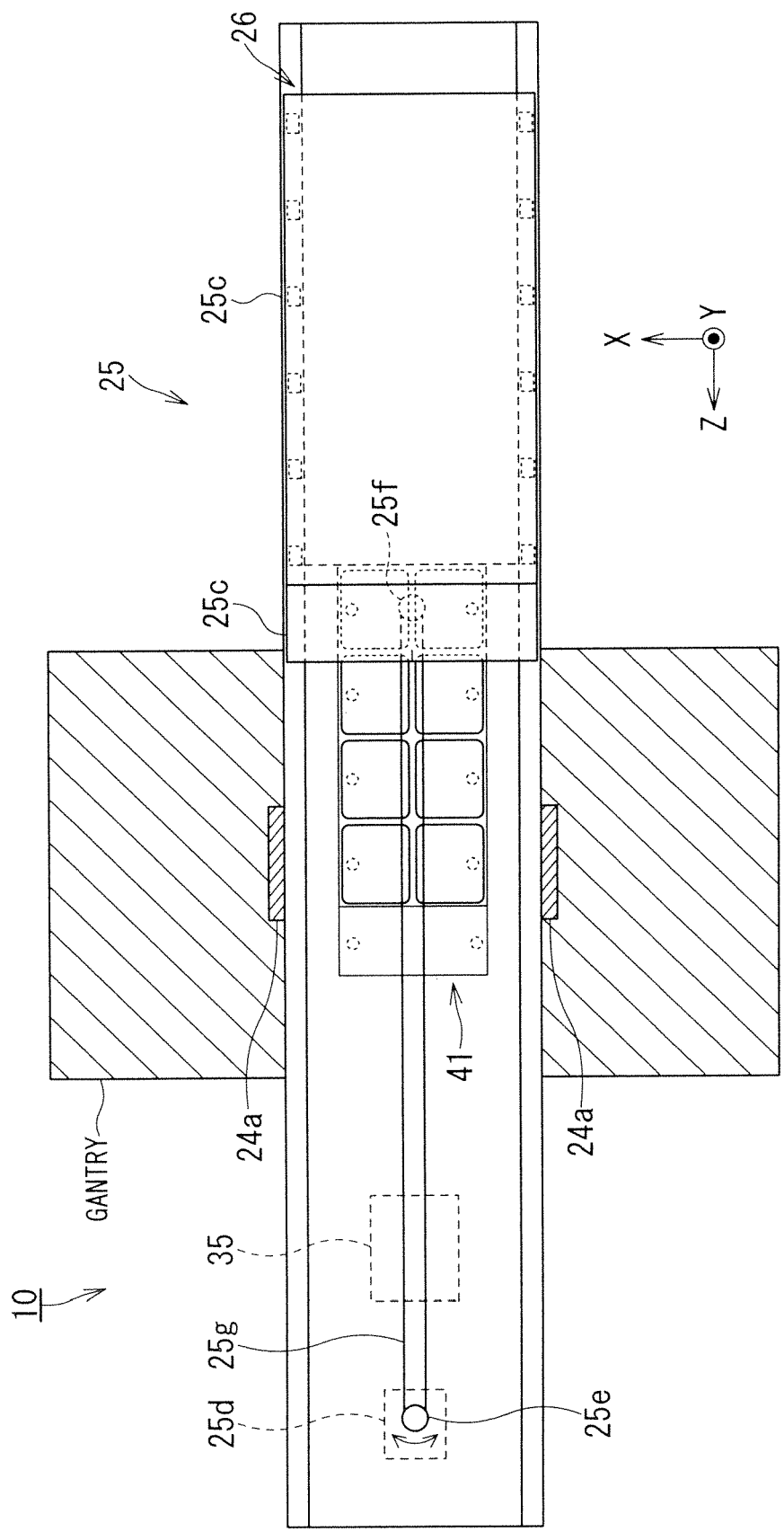
FIG. 12 is a cross-sectional view as viewed from above, similarly illustrating the configuration and the positional relationship.
Figure 13:
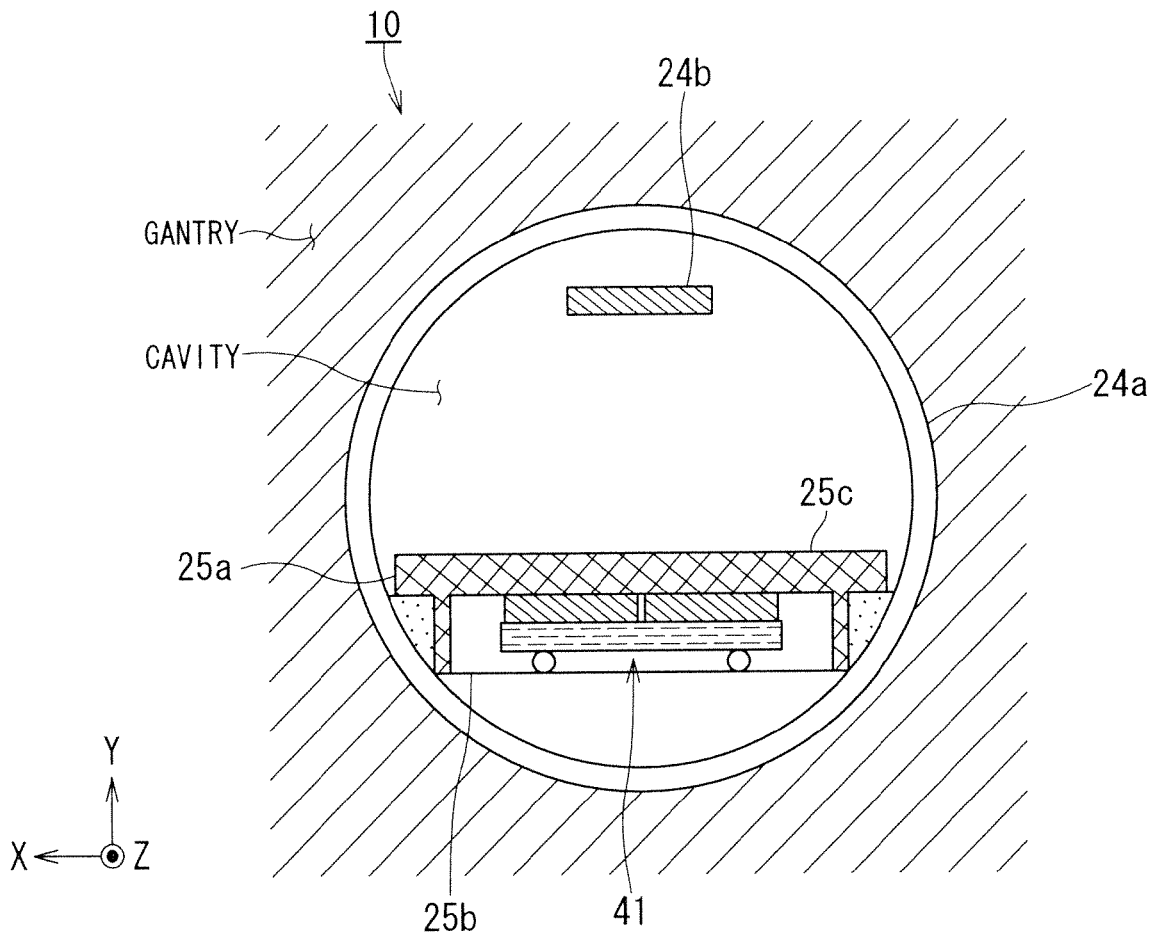
FIG. 13 is an arrow view along the XIII-XIII line, similarly illustrating the configuration and the positional relationship.

FIG. 11 is a cross-sectional view as viewed from a side, illustrating a configuration of the bed structure 25 and the positional relationship of the bed structure 25 and the lower coil carriage 41. FIG. 12 is a cross-sectional view as viewed from above, similarly illustrating the configuration and the positional relationship. FIG. 13 is an arrow view along the XIII-XIII line, similarly illustrating the configuration and the positional relationship.

The head side of the table-top 26 can be mechanically coupled to a trolley 25c, which is a power collector for moving the table-top 26 in the horizontal direction. The coupling is performed by a coupling mechanism (not illustrated), such as a hook, provided to at least one of the table-top 26 and the trolley 25c. The bed structure 25 is provided with a motor 25d disposed at a position distant from the head side of the table-top 26, a drive pulley 25e rotated by the motor 25d, an idle pulley 25f corresponding to the drive pulley 25e, and a timing belt 25g for winding the drive pulley 25e and the idle pulley 25f. The trolley 25c is coupled to a part of the timing belt 25g.

After the coupling between the table-top 26 and the trolley 25c, if the timing belt 25g is moved to draw the trolley 25c toward the drive pulley 25e, the table-top 26 can be advanced in the direction of the Z-axis (in the longitudinal direction of the table-top 26). Meanwhile, after the coupling between the table-top 26 and the trolley 25c, if the timing belt 25g is moved to withdraw the trolley 25c from the drive pulley 25e, the table-top 26 can be retreated in the direction of the Z-axis. The motor 25d and the drive pulley 25e do not necessarily need to be disposed on the head side of the table-top 26, and thus may be provided on the foot side of the table-top 26.

Further, the lower coil 24c is connected to the receiver 35, which receives the NMR signal of each of the imaged regions received by the lower coil 24c, via a received signal cable 25h serving as an electrical transmission medium. The receiver 35 may be configured to wirelessly receive the NMR signal of each of the imaged regions received by the lower coil 24c.

Meanwhile, the sequence controller 36 of the controlling system 12 illustrated in FIG. 1 is connected to the bed structure 25, the motor 25d, the gradient magnetic field power supply 32, the transmitter 34, and the receiver 35. The sequence controller 36 includes a not-illustrated control device, such as a central processing unit (CPU) as a processor and a memory, for example. The sequence controller 36 stores the control information required to drive the bed structure 25, the motor 25d, the gradient magnetic field power supply 32, the transmitter 34, and the receiver 35, such as the sequence information describing the operation control information including the intensity, the application time, and the application timing of pulse current which should be applied to the gradient magnetic field power supply 32, for example.

In accordance with a predetermined sequence stored in the sequence controller 36, the sequence controller 36 drives the bed structure 25 to advance or retreat the table-top 26 in the direction of the Z-axis 26 with respect to the gantry. Further, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and an RF signal in the gantry.

On the basis of the control information received from the sequence controller 36, the transmitter 34 supplies the RF signal to the RF coil 24. Meanwhile, the receiver 35 performs required signal processing on the NMR signal received from the RF coil 24, and performs A/D (analog to digital) conversion on the signal to generate raw data, i.e., the NMR signal digitized through the receiver 35. The receiver 35 then supplies the generated raw data to the sequence controller 36. Upon receipt of the raw data from the receiver 35, the sequence controller 36 supplies the data to the computer 37.

The computer 37 is formed by basic hardware of a computer, such as a CPU 51 as the processor, a memory 52, a hard disk (HD) 53, an interface (IF) 54, an input device 55, and a display device 56. Via a bus B serving as a common signal transmission line, the CPU 51 is interconnected with the respective hardware components 52, 53, 54, 55, and 56, which form the computer 37. Further, the computer 37 is connected to a main network N of a hospital, such as local area network (LAN), via the IF 54 such that the computer 37 and the network N can intercommunicate with each other. The computer 37 may include a drive for reading a variety of application programs and data from a medium which has stored the variety of application programs and data.

A program stored in the memory 52 is executed the CPU 51. Alternatively, a program stored in the HD 53 or a program transferred from the network N, received by the IF 54, and installed in the HD 53 is loaded into the memory 52 and executed by the CPU 51.

The memory 52 includes such elements as a read only memory (ROM) and a random access memory (RAM), and serves as a storage device used to store initial program loading (IPL), basic input/output system (BIOS), and data and to temporarily store the working memory and data of the CPU 51.

The HD 53 is a metal disk which a magnetic body is painted with or evaporated. The HD 53 is had built-in in a state that is impossible of putting on and taking off by a reading device (not illustrated). The HD 53 is a storage device for storing programs (including operating system (OS), for example, as well as the application programs) and data installed in the computer 37. Further, the HD 53 can provide a graphical user interface (GUI), which uses many graphics to display information for a user and enables basic operations to be performed through the input device 55.

The IF 54 is a communication control device for controlling communication in accordance with respective standards. The computer 37 can be connected to the network N by the IF 54.

The input device 55 includes a keyboard, a mouse, a joystick, and so forth operable by an operator, such as a medical technologist. An input signal according to the operation of the input device 55 is sent to the CPU 51.

The display device 56 includes a monitor, for example, and an MRI image is displayed through the monitor.

Description will now be made of the imaging operation of the MRI apparatus 10 according to the first embodiment, with reference to FIGS. 14 to 20 (cross-sectional views as viewed from a side).

Figure 14:
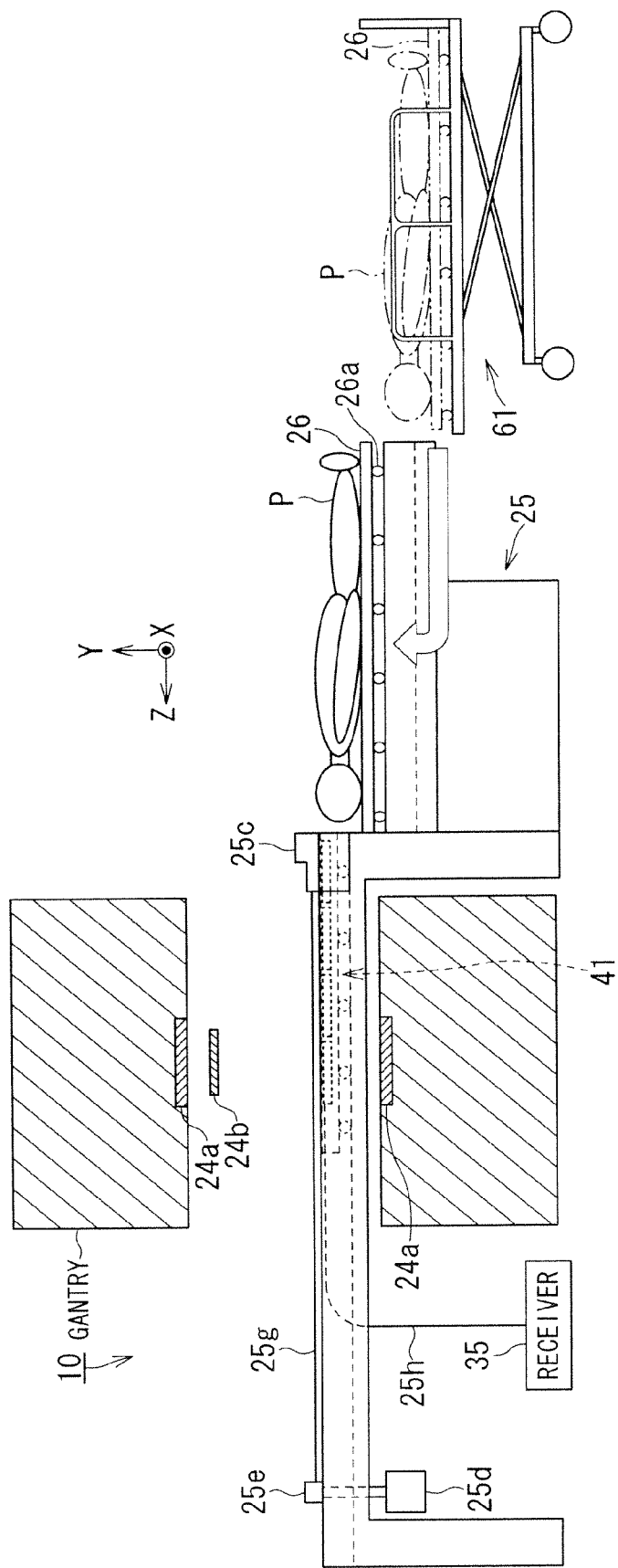
FIG. 14 is a diagram for explaining the elevation of the table-top in the preparation for the imaging operation.

FIG. 14 is a diagram for explaining the elevation of the table-top 26 in the preparation for the imaging operation.

With the use of the table-top rollers 26a, the operator first transfers the table-top 26, on which the patient P is placed, from a stretcher 61 onto the bed structure 25.

As the operator performs an operation of elevating the table-top 26, on which the patient P is placed, with the use of the input device 55 (illustrated in FIG. 1), the sequence controller 36 (illustrated in FIG. 1) controls the bed structure 25 to elevate the table-top 26. The bed structure 25 elevates the table-top 26, on which the patient P is placed, through a hydraulic cylinder, a lead screw, and so forth provided in the bed structure 25.

Figure 15:
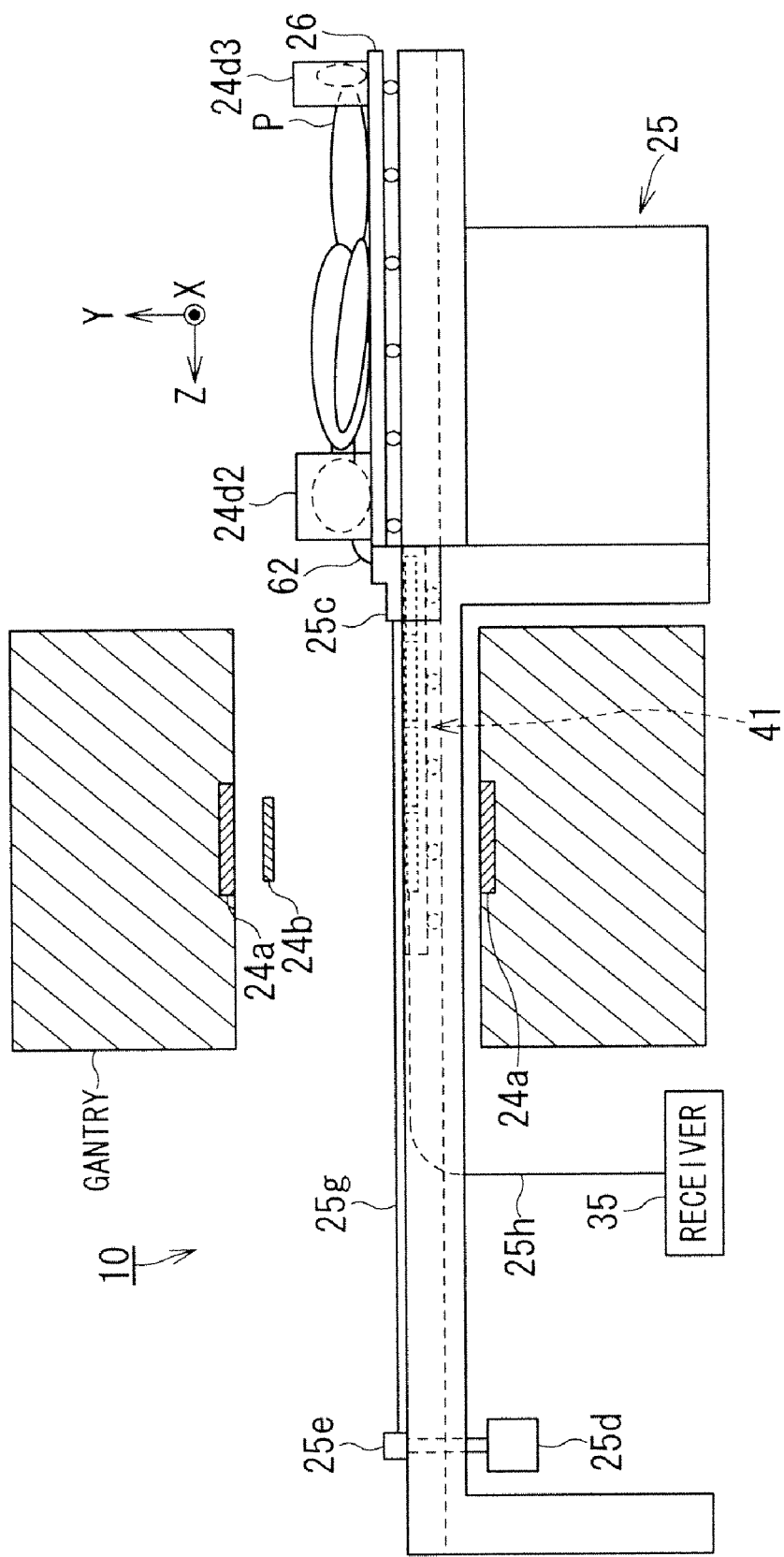
FIG. 15 is a diagram for explaining the attachment of the RF coil in the preparation for the imaging operation.

FIG. 15 is a diagram for explaining the attachment of the RF coil 24 in the preparation for the imaging operation.

As described with reference to FIG. 14, when the table-top 26 has been elevated such that the height thereof reaches a predetermined position in the relationship thereof with the trolley 25c, the sequence controller 36 controls the bed structure 25 to stop the elevation of the table-top 26. Then, the table-top 26 is mechanically coupled to the trolley 25c. In the above process, the coupling by the coupling mechanism, such as the hook, provided to at least one of the table-top 26 and the trolley 25c may be automatically performed at the same time as the completion of the elevation of the table-top 26. Alternatively, the coupling by the coupling mechanism may be manually performed after the completion of the elevation of the table-top 26.

Further, if necessary, the operator attaches the local site imaging coil 24d, which is a reception RF coil, to the patient P placed on the table-top 26. For example, to the head of the patient P placed on the table-top 26, the operator attaches a head coil 24d2, which is a local site imaging coil 24d having a chassis substantially fitting the outer shape of the head. Further, for example, to a foot of the patient P placed on the table-top 26, the operator attaches a foot coil 24d3, which is a local site imaging coil 24d having a chassis substantially fitting the outer shape of the foot. A jaw coil, a knee coil, or the like may be attached to the patient P as the local site imaging coil 24d.

Then, the operator electrically connects a cable 62 of the head coil 24d2 and a cable (not illustrated) of the foot coil 24d3 to respective connectors (not illustrated) provided to the trolley 25c.

In the above process, the cable connection to the lower coil 24c is unnecessary. Thus, there is an advantage in that the number of connected cables is smaller than in the coil system in which the lower coil 24c is previously disposed under the table-top 26.

Figure 16:
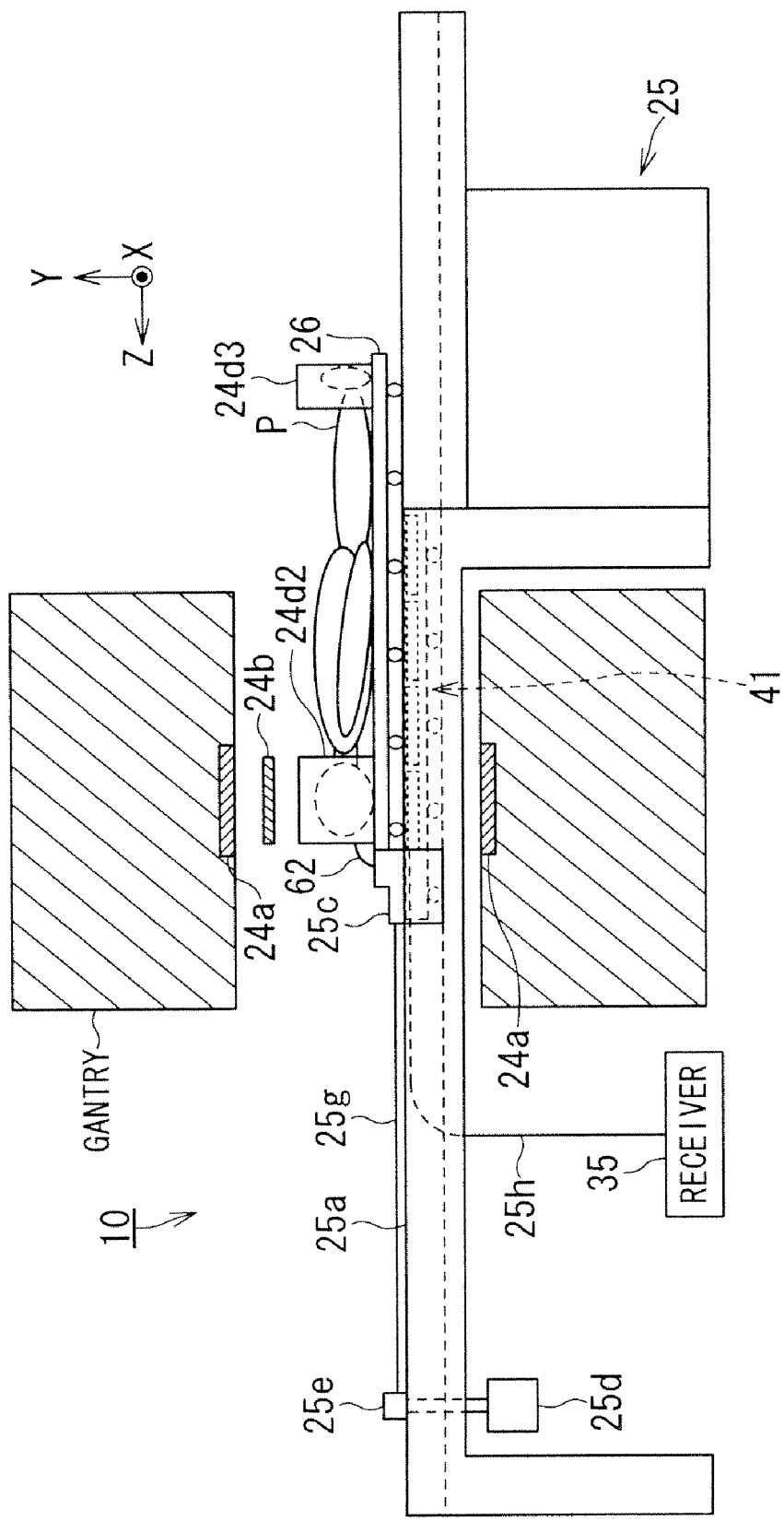
FIG. 16 is a diagram for explaining an imaging of a head.

FIG. 16 is a diagram for explaining an imaging of a head.

In accordance with the predetermined sequence stored in the sequence controller 36, the sequence controller 36 drives the motor 25d to draw the trolley 25c toward the drive pulley 25e through the timing belt 25g. That is, the table-top 26 is moved from the position illustrated in FIG. 15 to a head imaging position. Then, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the head coil 24d2 via the received signal cable 25h, the imaging of the head of the patient P is performed.

An image obtained by the imaging of the head is stored in a storage device, such as the HD 53 (illustrated in FIG. 1) of the computer 37, displayed on the display device 56 (illustrated in FIG. 1), or transmitted to the network N (illustrated in FIG. 1) via the IF 54 (illustrated in FIG. 1).

Figure 17:
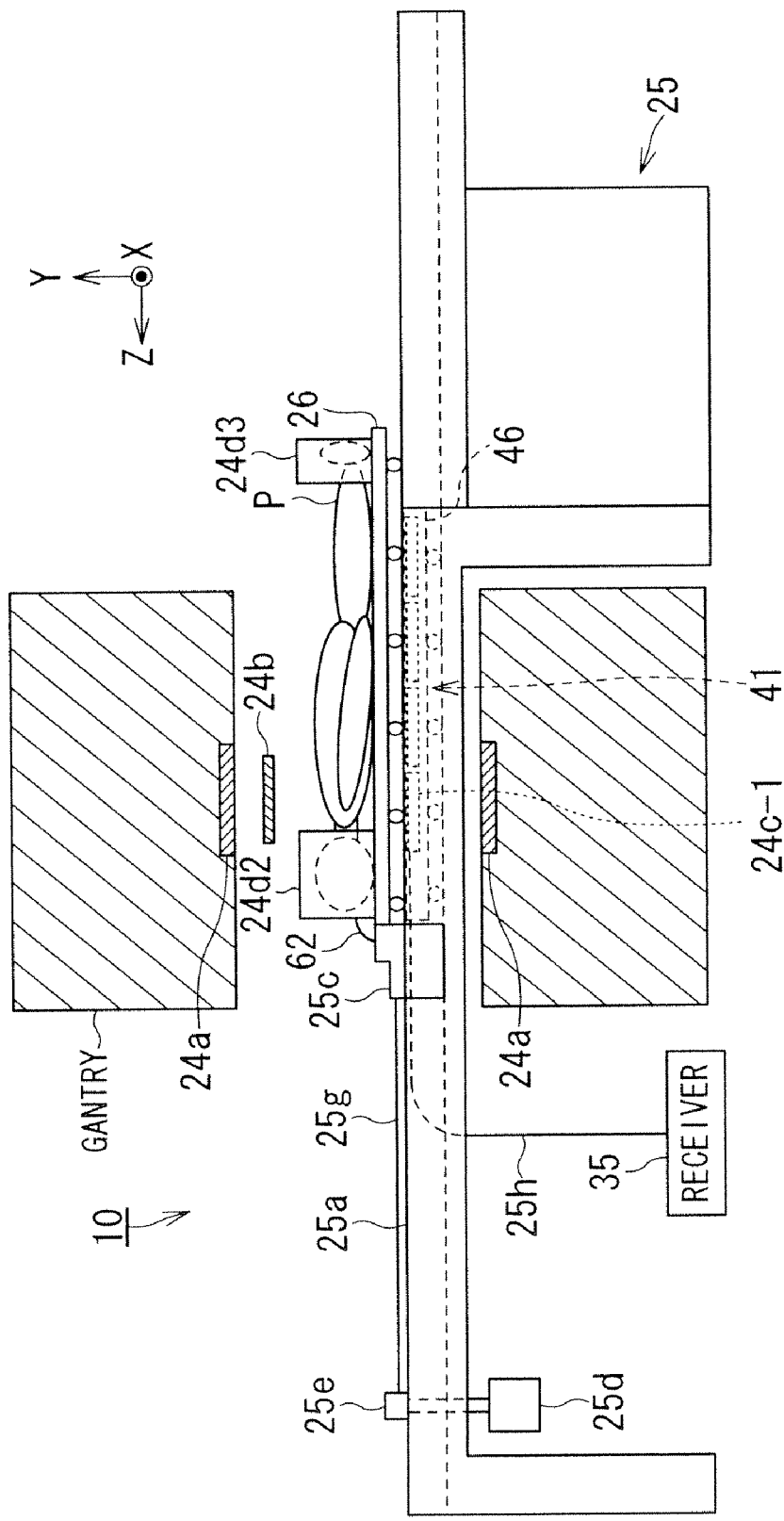
FIG. 17 is a diagram for explaining an imaging of a neck.

FIG. 17 is a diagram for explaining an imaging of a neck.

After the imaging of the head, the sequence controller 36 drives the motor 25d in accordance with the stored predetermined sequence to draw the trolley 25c toward the drive pulley 25e through the timing belt 25g. That is, the table-top 26 is moved from the head imaging position illustrated in FIG. 16 to a neck imaging position. Then, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the upper coil 24b and the lower coil element 24c-1 via the received signal cable 25h, the imaging of the neck of the patient P is performed.

An image obtained by the imaging of the neck is stored in the storage device, such as the HD 53 of the computer 37, displayed on the display device 56, or transmitted to the network N via the IF 54.

Further, when the table-top 26 reaches a predetermined position, the lower coil carriage 41 mounted with the lower coil 24c is mechanically coupled to the trolley 25c. In the first embodiment, when the table-top 26 reaches the neck imaging position, the lower coil carriage 41 mounted with the lower coil 24c is mechanically coupled to the trolley 25c. In the above process, the coupling between the lower coil carriage 41 and the trolley 25c performed by the coupling mechanism may be automatically performed at the same time as the arrival of the table-top 26 at the neck imaging position. Alternatively, the coupling by the coupling mechanism may be manually performed after the arrival of the table-top 26 at the neck imaging position. After the coupling, therefore, the table-top 26 and the lower coil carriage 41, which are connected to the trolley 25c, are integrally moved in accordance with the movement of the trolley 25c.

The trolley 25c and the lower coil carriage 41 do not necessarily need to be coupled at the neck imaging position. To select the most suitable coil for the physical size of the patient P and the region of interest, it is preferable to freely select the connection position of the table-top 26 and the lower coil 24c in accordance with the relative positional relationship between the table-top 26 and the lower coil 24c.

In the above, the lower coil carriage 41 is formed with a plurality of holes in the direction of the Z-axis, while the trolley 25c is provided with hooks which fit in and engage with the holes. Then, the engaging position of the plurality of holes of the lower coil carriage 41 and the hooks of the trolley 25c is changed to change the relative positional relationship between the lower coil 24c and the trolley 25c. Alternatively, the relative positional relationship between the lower coil 24c and the trolley 25c is changed by a braking mechanism using the friction of the carriage rollers 41a of the lower coil carriage 41.

The lower coil carriage 41 and the trolley 25c may be coupled to each other such that the lower coil carriage 41 can move in the direction of the X-axis with respect to the trolley 25c. In such a case, the most suitable lower coil element 24c-m can be selected from the lower coil 24c in accordance with the region to be imaged (e.g., a shoulder).

Figure 18:
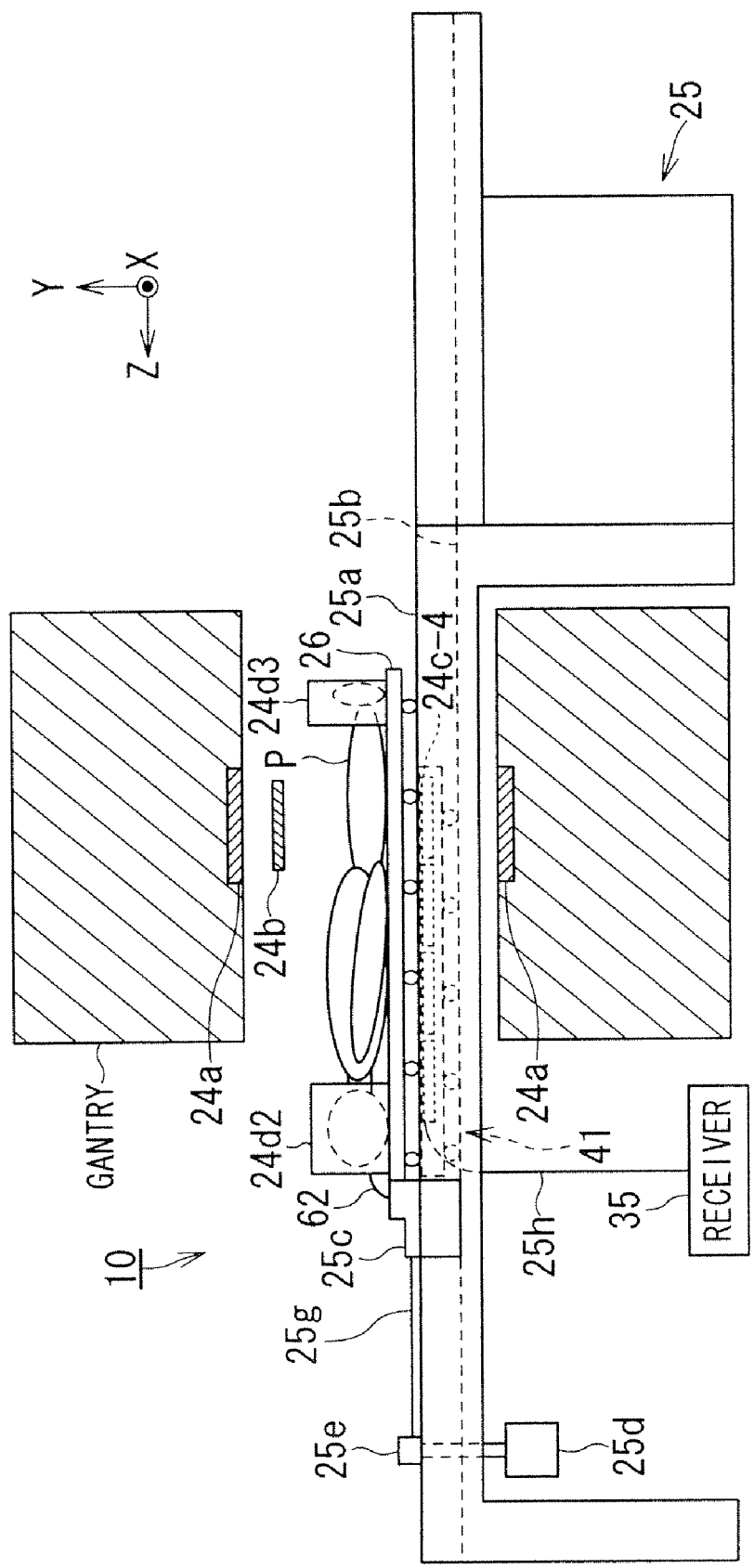
FIG. 18 is a diagram for explaining an imaging of a leg.

FIG. 18 is a diagram for explaining an imaging of a leg.

After the imaging of the neck, in accordance with the predetermined sequence stored in the sequence controller 36, the sequence controller 36 drives the motor 25d to draw the trolley 25c toward the drive pulley 25e through the timing belt 25g. That is, the table-top 26 is moved from the neck imaging position illustrated in FIG. 17 to a leg imaging position. Then, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the upper coil 24b and the lower coil element 24c-4 via the received signal cable 25h, the imaging of a leg of the patient P is performed. Sequential imaging of regions from the neck to the leg can be also performed by using the upper coil 24b and the lower coil elements 24c-2 and 24c-3.

An image obtained by the imaging of the leg is stored in the storage device, such as the HD 53 of the computer 37, displayed on the display device 56, or transmitted to the network N via the IF 54.

Figure 19:
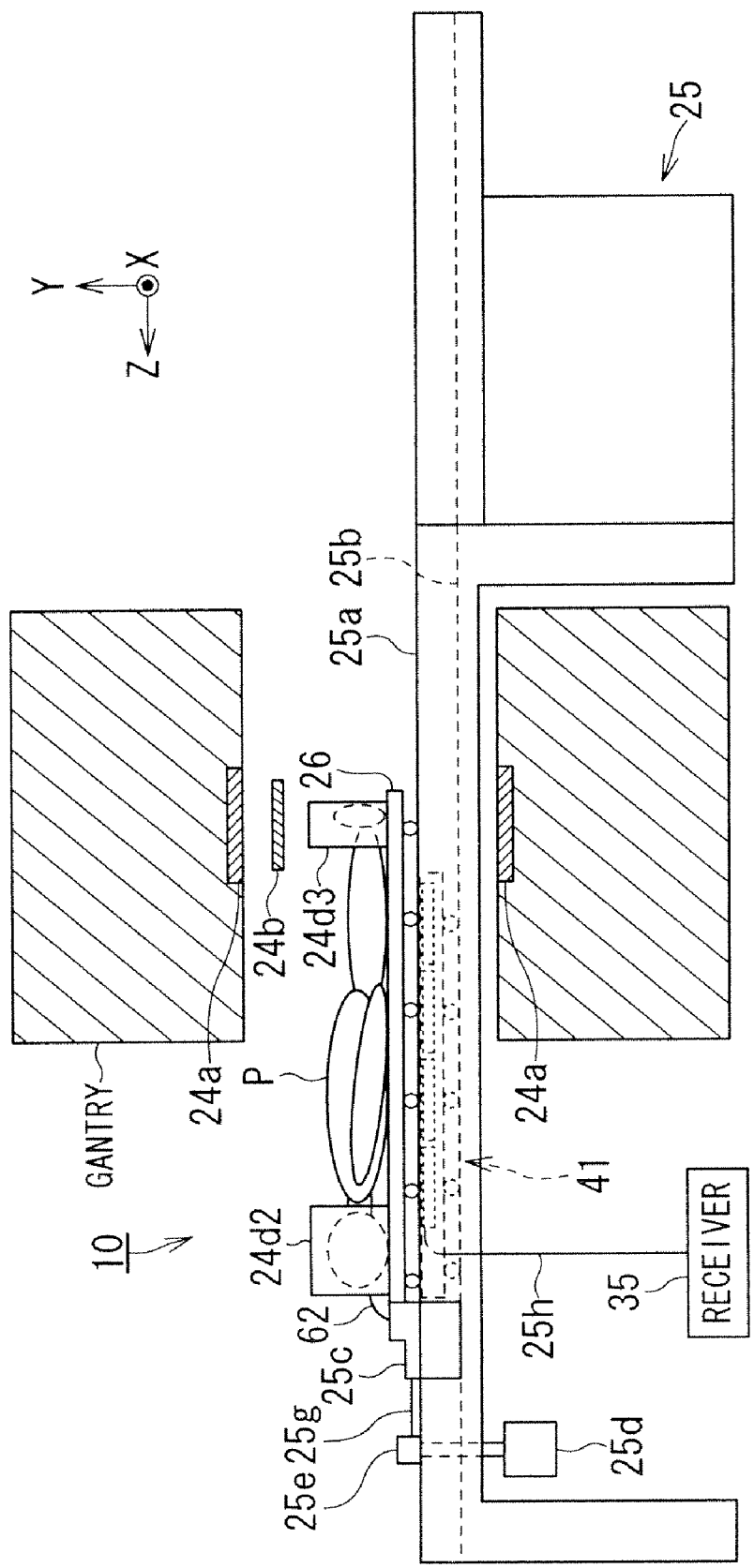
FIG. 19 is a diagram for explaining an imaging of a foot.

FIG. 19 is a diagram for explaining an imaging of a foot.

After the imaging of the leg, in accordance with the predetermined sequence stored in the sequence controller 36, the sequence controller 36 drives the motor 25d to draw the trolley 25c toward the drive pulley 25e through the timing belt 25g. That is, the table-top 26 is moved from the leg imaging position illustrated in FIG. 18 to a foot imaging position. Then, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the foot coil 24d3 via the received signal cable 25h, the imaging of a foot of the patient P is performed.

An image obtained by the imaging of the foot is stored in the storage device, such as the HD 53 of the computer 37, displayed on the display device 56, or transmitted to the network N via the IF 54.

After the completion of the imaging of the foot, the sequence controller 36 drives the motor 25d in accordance with the stored predetermined sequence to withdraw the trolley 25c from the drive pulley 25e through the timing belt 25g. The table-top 26 and the lower coil carriage 41, which are coupled to and integrated with the trolley 25c, are moved to the position illustrated in FIG. 17. Then, the coupling between the lower coil carriage 41 and the trolley 25c is released at the position. In the above process, the coupling between the lower coil carriage 41 and the trolley 25c may be automatically released at the same time as the arrival of the table-top 26 at the position illustrated in FIG. 17. Alternatively, the coupling may be manually released after the arrival of the table-top 26 at the position illustrated in FIG. 17.

Then, in accordance with the stored predetermined sequence, the sequence controller 36 drives the motor 25d to withdraw the trolley 25c from the drive pulley 25e through the timing belt 25g. Released from the coupling with the lower coil carriage 41, the trolley 25c is moved to the position illustrated in FIG. 15. Then, the coupling between the table-top 26 and the trolley 25c is released. In the above process, the coupling between the table-top 26 and the trolley 25c may be automatically released at the same time as the arrival of the table-top 26 at the position illustrated in FIG. 15. Alternatively, the coupling may be manually released after the arrival of the table-top 26 at the position illustrated in FIG. 15.

Further, the operator releases the electrical connection between the trolley 25c and the cable 62 of the head coil 24d2 attached to the head of the patient P, and detaches the head coil 24d2 from the patient P. Further, the operator releases the electrical connection between the trolley 25c and the cable (not illustrated) of the foot coil 24d3 attached to the foot of the patient P, and detaches the foot coil 24d3 from the patient P.

Then, the operator performs an operation of lowering the table-top 26, on which the patient P is placed, with the use of the input device 55. Thereby, the sequence controller 36 controls the bed structure 25 to lower the table-top 26. With the use of the table-top rollers 26a, the operator transfers the table-top 26, on which the patient P is placed, onto the stretcher 61.

Figure 20:
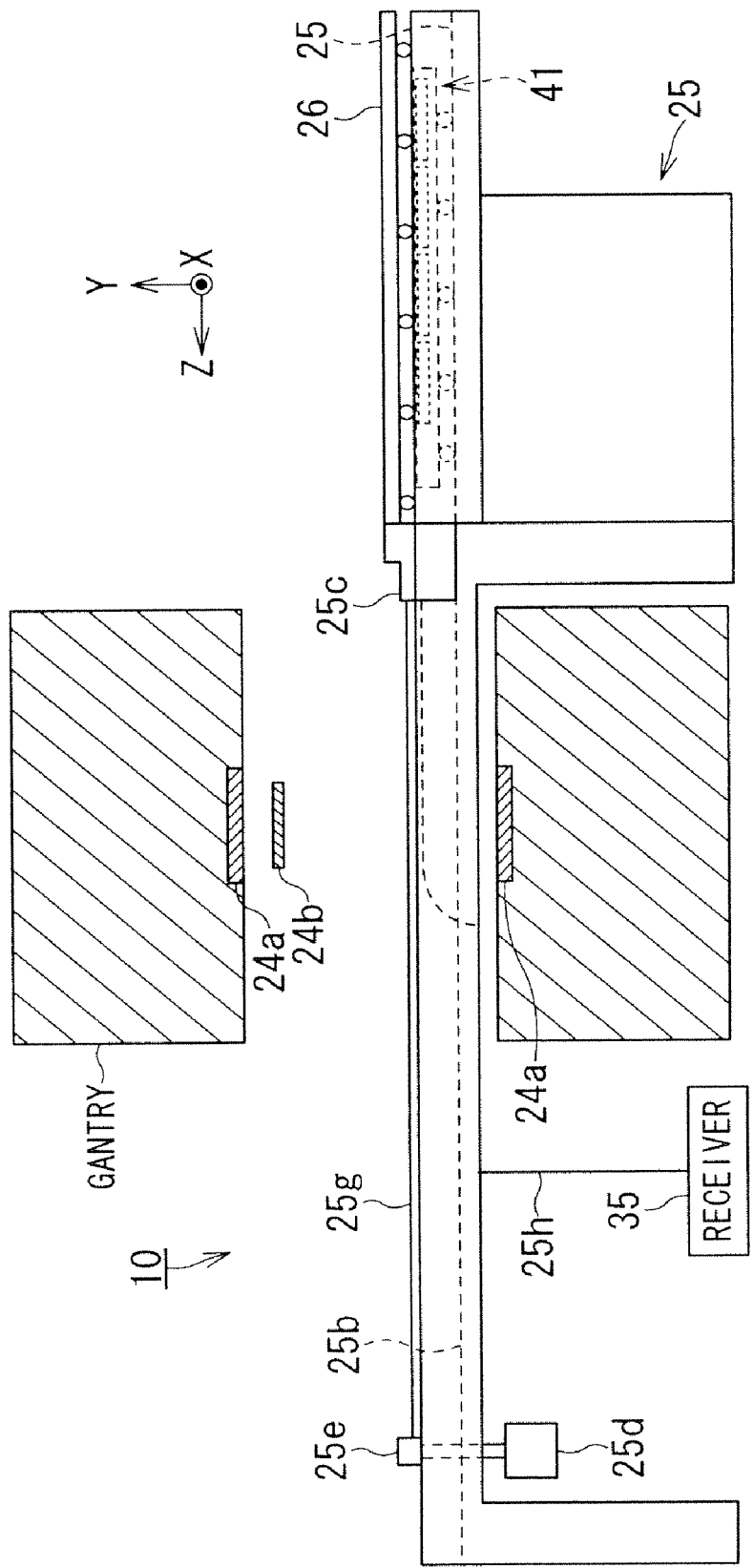
FIG. 20 is a diagram for explaining a retreat of the lower coil.

FIG. 20 is a diagram for explaining the retreat of the lower coil 24c.

When the lower coil 24c is not used, the mechanical and electrical connection between the receiver 35 and the lower coil carriage 41 mounted with the lower coil 24c is released, and the lower coil carriage 41 is retreated to the outside of the gantry along the carriage roller moving path 25b extending toward the rear side.

According to the MRI apparatus 10 of the first embodiment, the length of the cable connected to the lower coil 24c can be reduced. Accordingly, a good image having no deterioration in the S/N ratio can be obtained.

Further, according to the MRI apparatus 10 of the first embodiment, the lower coil 24c can be retreated to the rear side of the gantry. Accordingly, a factor deteriorating the coil performance is eliminated, and a good image can be obtained.

Furthermore, according to the MRI apparatus 10 of the first embodiment, the lower coil 24c can be freely selected with respect to the upper coil 24b (the body coil 24d1) and can be moved in the width direction of the table-top 26. Accordingly, a good image can be obtained with the most suitable coil with no concern for the positioning (e.g., the position and the physical size) of the patient.

In addition, according to the MRI apparatus 10 of the first embodiment, only the table-top 26 is transferred. Accordingly, an extra lower coil 24c is unnecessary, and the transfer of the patient P to and from the stretcher 61 can be performed inexpensively and smoothly.

Second Embodiment

The configuration of an MRI apparatus 10A according to a second embodiment is the same as the configuration of the MRI apparatus 10 illustrated in FIG. 1. Thus, description thereof will be omitted. Further, similarly to the case of the MRI apparatus 10, FIGS. 2 to 5 also apply to the MRI apparatus 10A.

Figure 21:
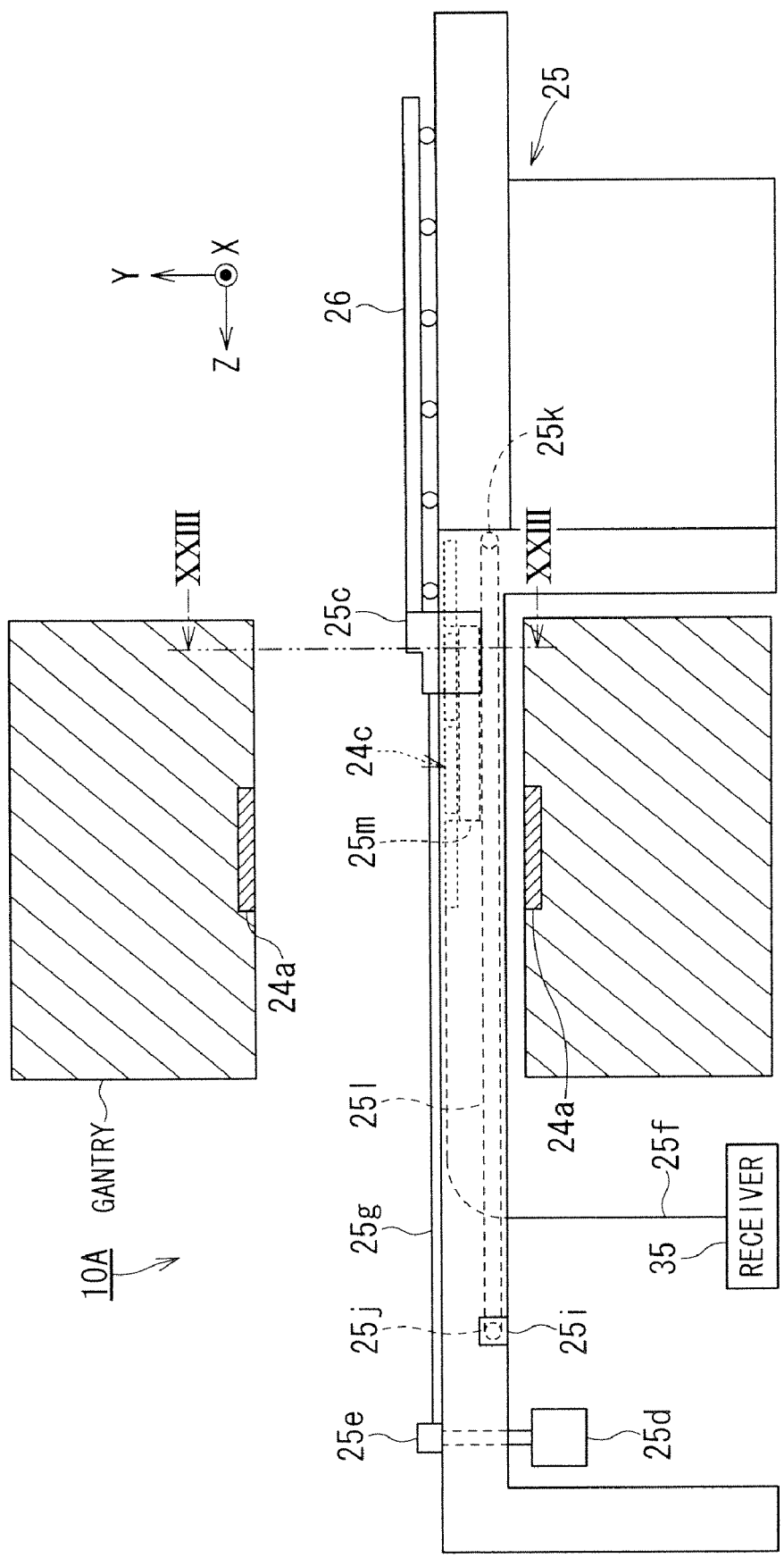
FIG. 21 is a cross-sectional view as viewed from a side, illustrating a positional relationship of the table-top and the lower coil and a movement control unit for controlling the movement of the lower coil in the horizontal direction.
Figure 22:
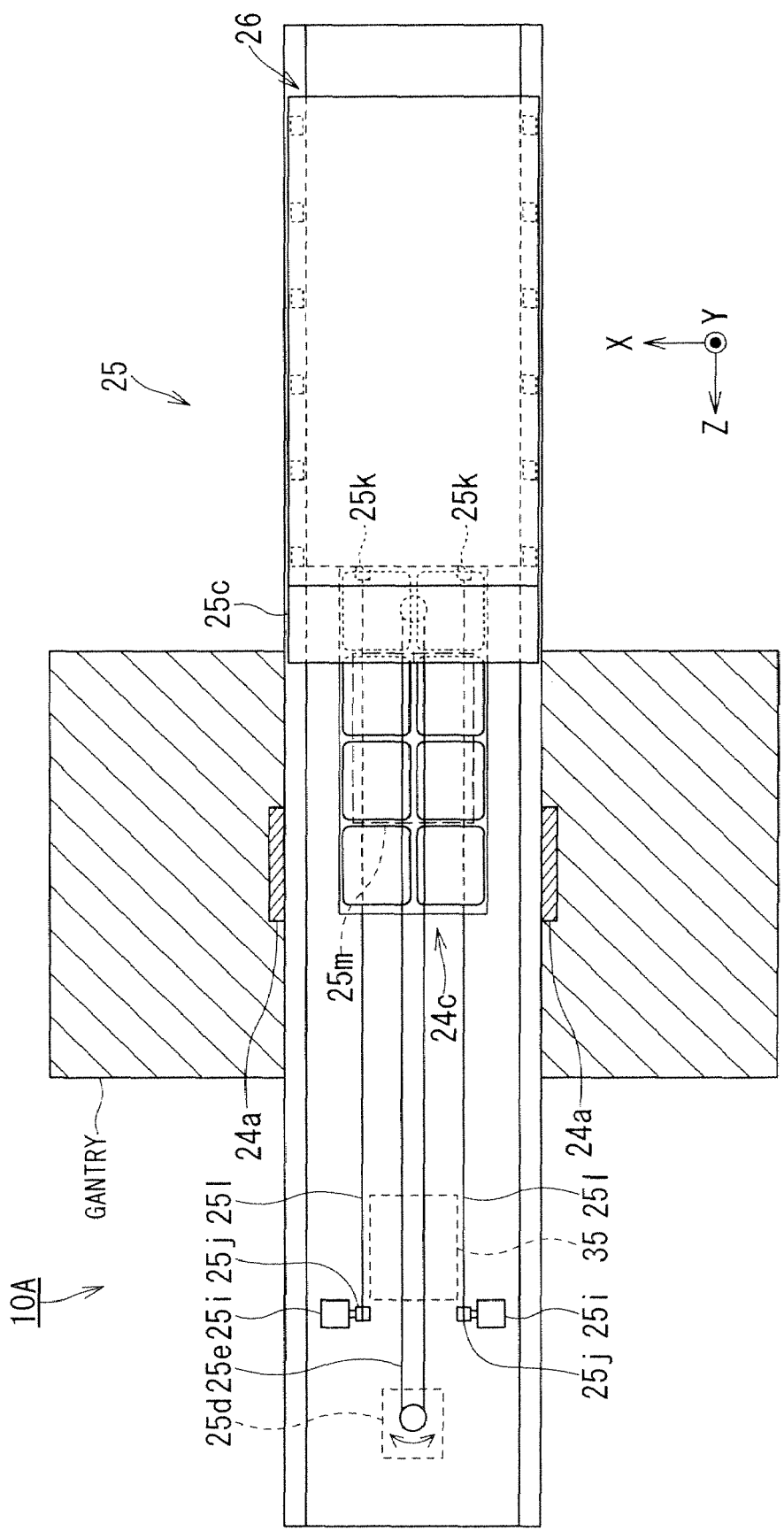
FIG. 22 is a cross-sectional view as viewed from above, illustrating a movement control unit for controlling a movement of the lower coil in the horizontal direction.
Figure 23:
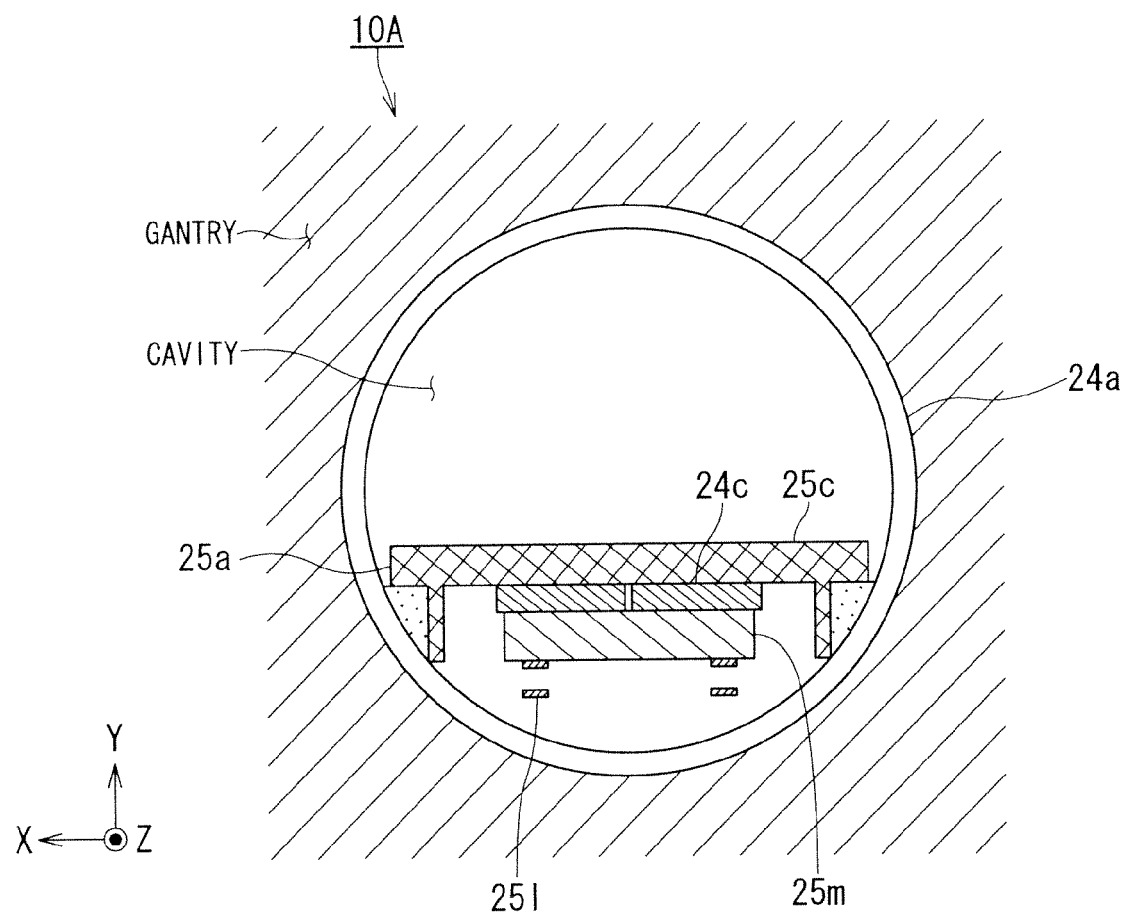
FIG. 23 is an arrow view along the XXIII-XXIII line, illustrating the movement control unit for controlling the movement of the lower coil in the horizontal direction.

FIG. 21 is a cross-sectional view as viewed from a side, illustrating the positional relationship of the table-top 26 and the lower coil 24c and a movement control unit for controlling the movement of the lower coil 24c in the horizontal direction. FIG. 22 is a cross-sectional view as viewed from above, illustrating the movement control unit for controlling the movement of the lower coil 24c in the horizontal direction. FIG. 23 is an arrow view along the XXIII-XXIII line, illustrating the movement control unit for controlling the movement of the lower coil 24c in the horizontal direction. In FIGS. 21 to 35, description will be made by taking an example in which the RF coil 24 for imaging an upper part of the patient P is the body coil 24d1 (the second example illustrated in FIG. 3). However, the description similarly applies to an example in which the RF coil 24 for imaging an upper part of the patient P is the upper coil 24b stored in the gantry (the first example illustrated in FIG. 2).

The WB coil 24a of the MRI apparatus 10A is provided in the gantry about the body axis of the patient P in the circumferential direction. The lower coil 24c (the lower coil elements 24c-1, 24c-2, 24c-3, and 24c-4) is provided below the table-top 26. The table-top 26, on which the patient P is placed, is elevated or lowered in the direction of the Y-axis and advanced or retreated in the direction of the Z-axis by the bed structure 25.

A lower part of the table-top 26 of the bed structure 25 is provided with the cylindrical table-top rollers 26a for advancing or retreating the table-top 26 in the direction of the Z-axis with respect to the cavity inside the gantry. As the table-top rollers 26a are advanced or retreated on the table-top roller moving path 25a, the table-top 26 is advanced or retreated in the direction of the Z-axis with respect to the cavity inside the gantry.

Further, the MRI apparatus 10A is provided with a movement control unit for controlling the lower coil 24c to be movable. The movement control unit includes two motors 25i disposed at positions distant from the head side of the table-top 26, two drive pulleys 25j rotated by the respective motors 25i, two idle pulleys 25k corresponding to the respective drive pulleys 25j, two timing belts 25l for winding the drive pulleys 25j and the idle pulleys 25k, and a coil base unit 25m for transmitting the power of the timing belts 25l to the lower coil 24c. Each of the motors 25i and the drive pulleys 25j does not necessarily need to be disposed on the head side of the table-top 26, and thus may be provided on the foot side of the table-top 26.

Figure 24:
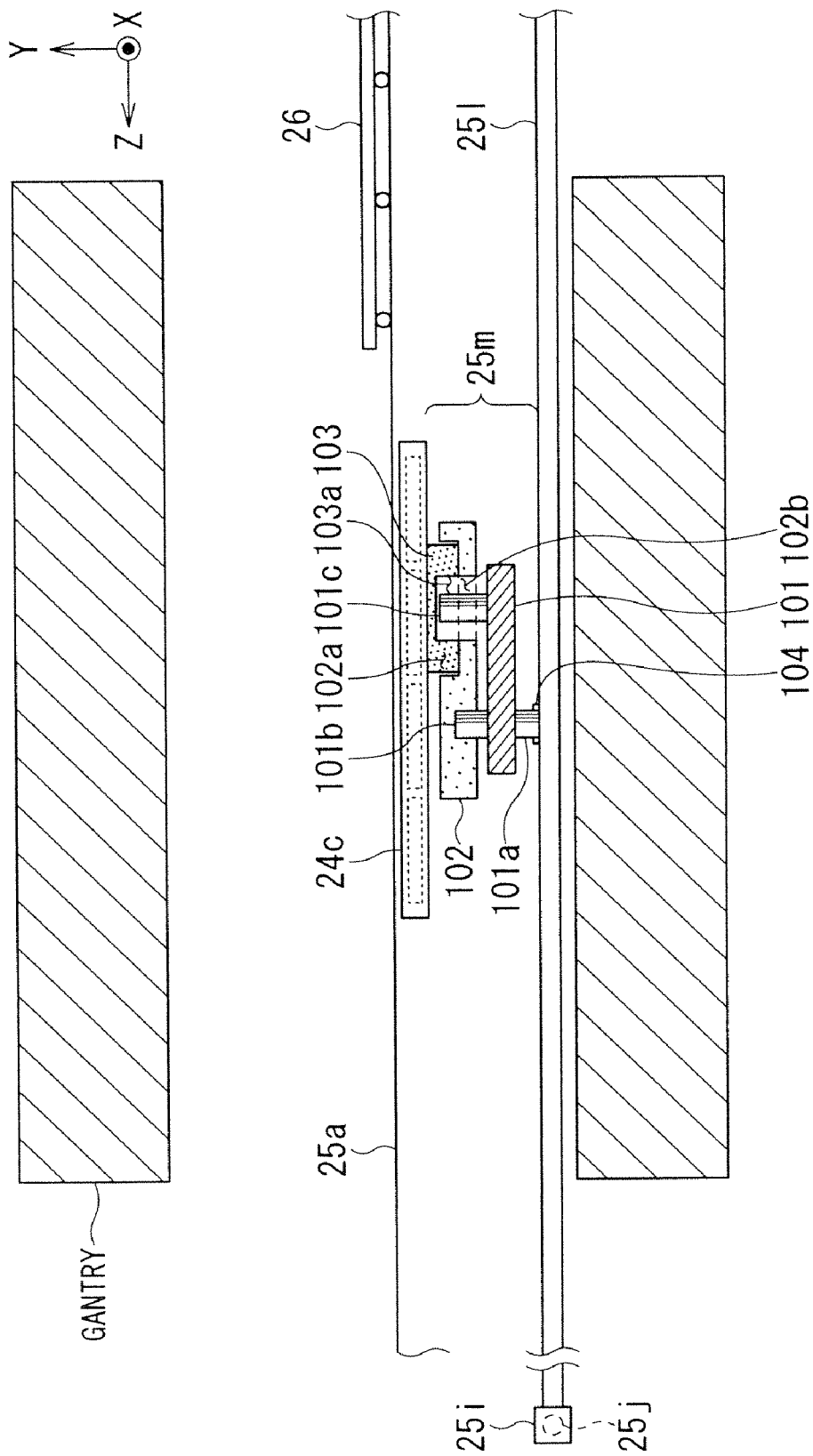
FIG. 24 is a cross-sectional view as viewed from a side, illustrating a configuration of a coil base unit.
Figure 25:
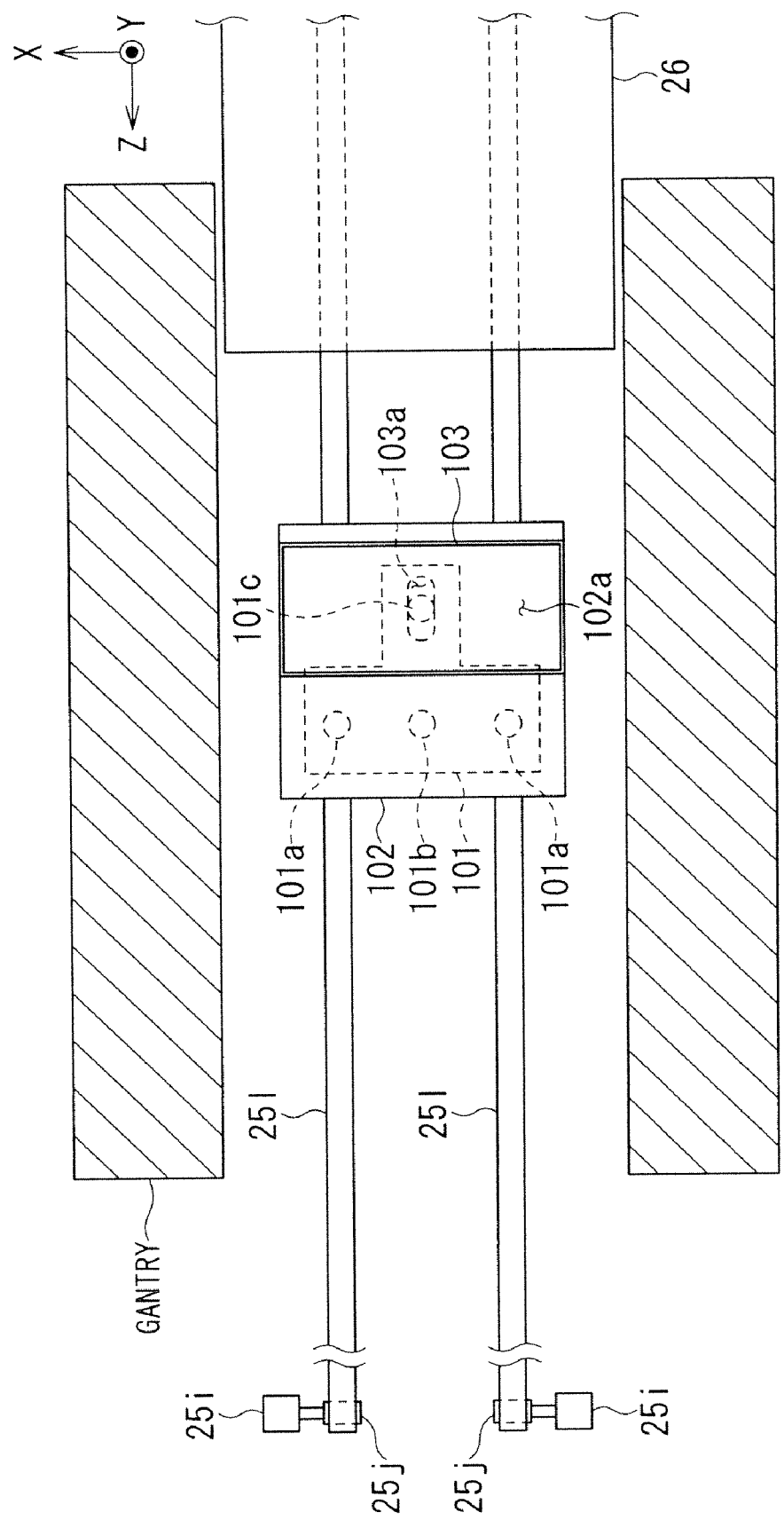
FIG. 25 is a cross-sectional view as viewed from above, similarly illustrating the configuration.

FIG. 24 is a cross-sectional view as viewed from a side, illustrating a configuration of the coil base unit 25m. FIG. 25 is a cross-sectional view as viewed from above, similarly illustrating the configuration.

As illustrated in FIGS. 24 and 25, the coil base unit 25m is provided with a central link 101, a Z-axis direction moving plate 102, and an X-axis direction moving plate 103.

The central link 101 has a T-shape, for example, and includes a central base portion and two wing portions. The two wing portions of the central link 101 are respectively formed with projections 101a projecting in the direction of the respective timing belts 25l. The central link 101 engages with a part of each of the timing belts 25l via the respective projections 101a. Specifically, each of the projections 101a of the central link 101 is inserted in a boss-like bearing 104 provided to a part of the corresponding one of the timing belts 25l. Thereby, each of the two wing portions of the central link 101 engages with a part of the corresponding one of the timing belts 25l.

Further, the central link 101 is formed with a projection 101b projecting from the central base portion between the projections 101a in the direction of the Z-axis direction moving plate 102. The central link 101 engages with a part of the Z-axis direction moving plate 102 via the projection 101b.

Furthermore, the central link 101 is formed with a projection 101c projecting from the leg side of the central base portion in the direction of the X-axis direction moving plate 103. The central link 101 engages with a part of the X-axis direction moving plate 103 via the projection 101c.

The Z-axis direction moving plate 102 supports the X-axis direction moving plate 103 via an X-axis direction slide groove 102a, in which the X-axis direction moving plate 103 can move in the direction of the X-axis. Further, the Z-axis direction moving plate 102 engages with the projection 101b of the central link 101 to be coupled to the central link 101. Furthermore, the Z-axis direction moving plate 102 is provided with a long hole 102b, which can, in a removable state, insert the projection 101c that moves in the horizontal direction. The long hole 102b is formed so as not to interrupt the movement of the projection 101c.

The X-axis direction moving plate 103 supports the lower coil 24c. Further, the X-axis direction moving plate 103 is formed with a long groove 103a, in which the projection 101c of the central link 101 can move only in the direction of the Z-axis. The X-axis direction moving plate 103 engages with the projection 101c via the long groove 103a.

In the above, if the respective timing belts 25l are moved in the same direction to draw the central link 101 toward the respective drive pulleys 25j, the Z-axis direction moving plate 102 is moved in the direction of the Z-axis via the central link 101. If the Z-axis direction moving plate 102 is moved in the direction of the Z-axis, the lower coil 24c can be advanced or retreated in the direction of the Z-axis via the X-axis direction moving plate 103.

Figure 26:
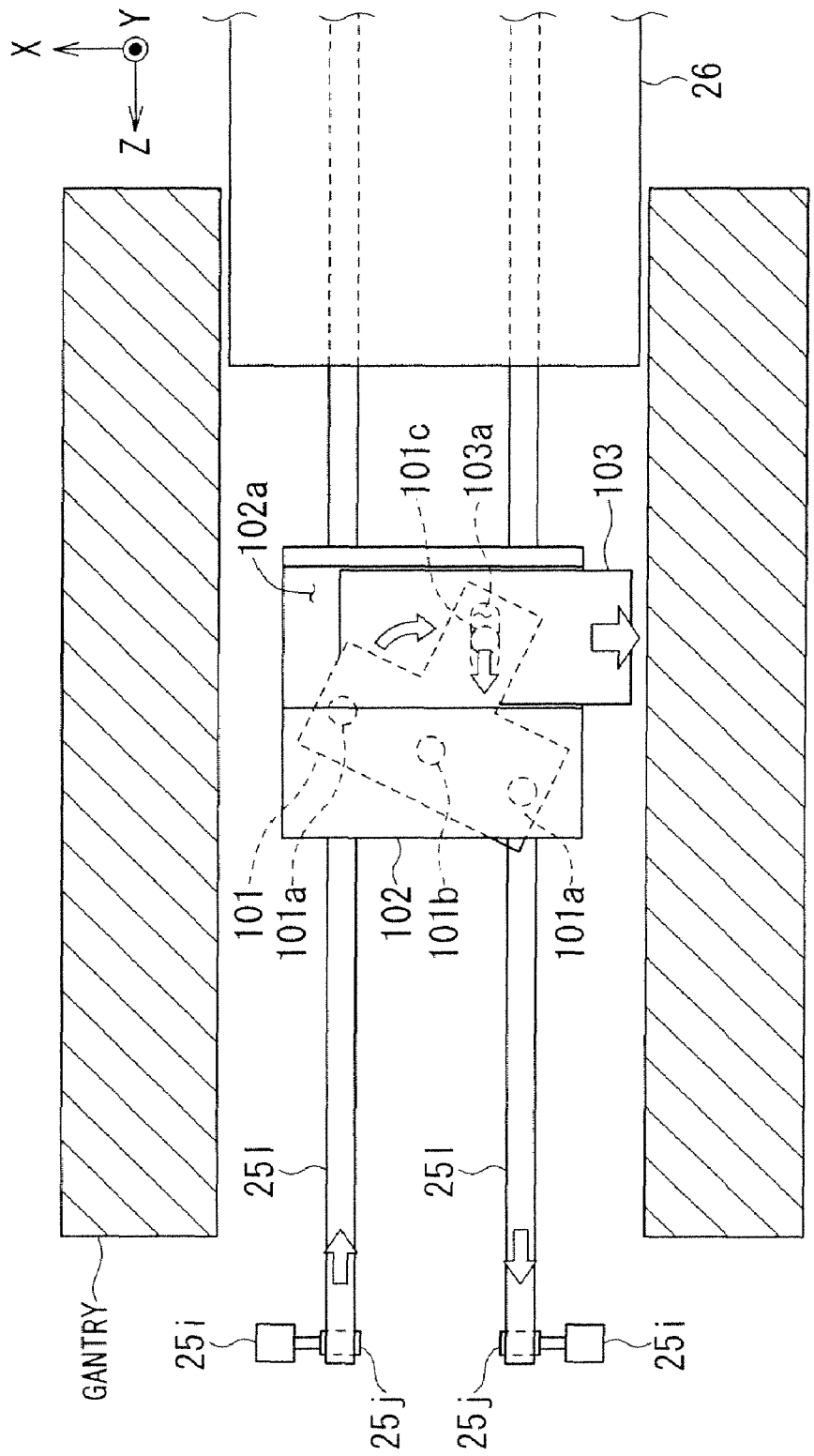
FIG. 26 is a diagram (a cross-sectional view as viewed from above) for explaining the movement of the lower coil in the direction of the X-axis.

FIG. 26 is a diagram (a cross-sectional view as viewed from above) for explaining the movement of the lower coil 24c in the direction of the X-axis.

As illustrated in FIG. 26, if the respective timing belts 25l are moved in different directions from each other, the central link 101 is rotated about the projection 101b. Due to the rotation of the central link 101, the projection 101c of the central link 101 moves in the direction of the Z-axis while pushing the X-axis direction moving plate 103 in the direction of the X-axis. Accordingly, being pushed by the projection 101c of the central link 101, the X-axis direction moving plate 103 moves in the direction of the X-axis on the X-axis direction slide groove 102a. Thereby, the lower coil 24c supported by the X-axis direction moving plate 103 is moved in the direction of the X-axis.

Figure 27:
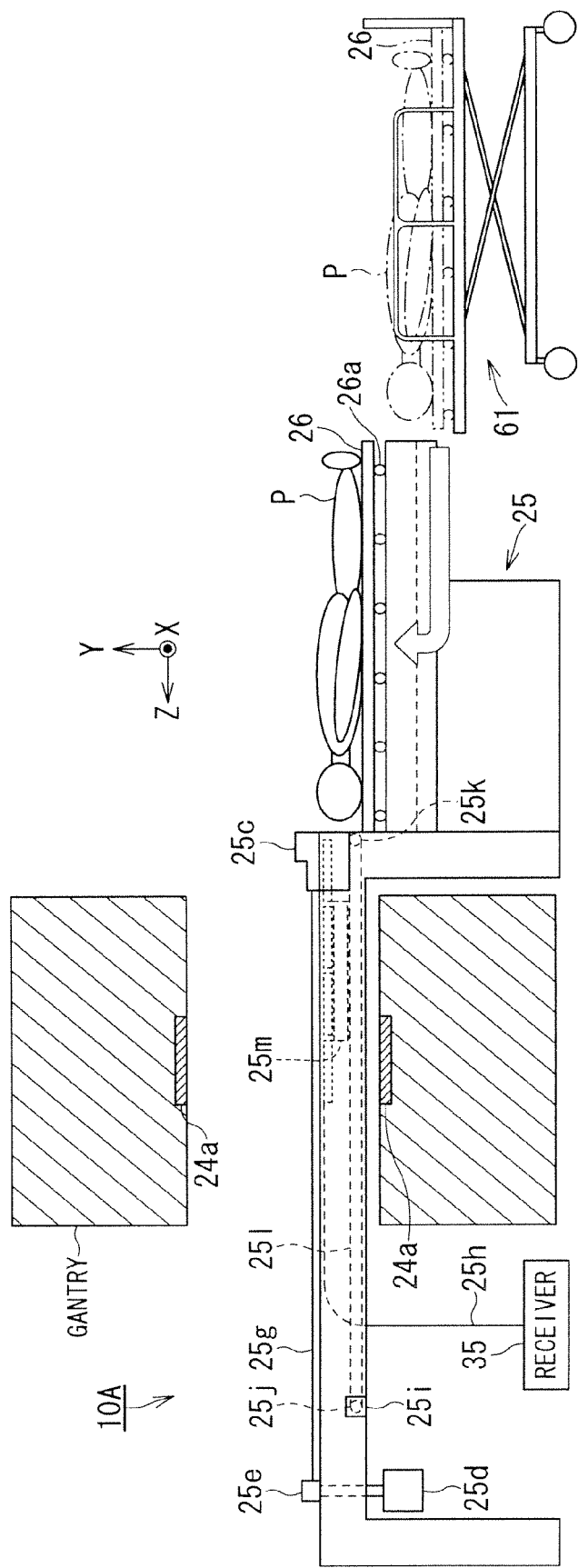
FIG. 27 is a diagram for explaining the elevation of the table-top in the preparation for the imaging operation.

Subsequently, with reference to FIGS. 27 to 35, description will be made of the imaging operation of the MRI apparatus 10A according to the second embodiment. FIG. 27 is a diagram for explaining the elevation of the table-top 26 in the preparation for the imaging operation.

With the use of the table-top rollers 26a, the operator first transfers the table-top 26, on which the patient P is placed, from the stretcher 61 onto the bed framework 25.

As the operator performs an operation of elevating the table-top 26, on which the patient P is placed, with the use of the input device 55 (illustrated in FIG. 1), the sequence controller 36 (illustrated in FIG. 1) controls the bed structure 25 to elevate the table-top 26. The bed structure 25 elevates the table-top 26, on which the patient P is placed, through the hydraulic cylinder, the lead screw, and so forth provided in the bed structure 25.

Figure 28:
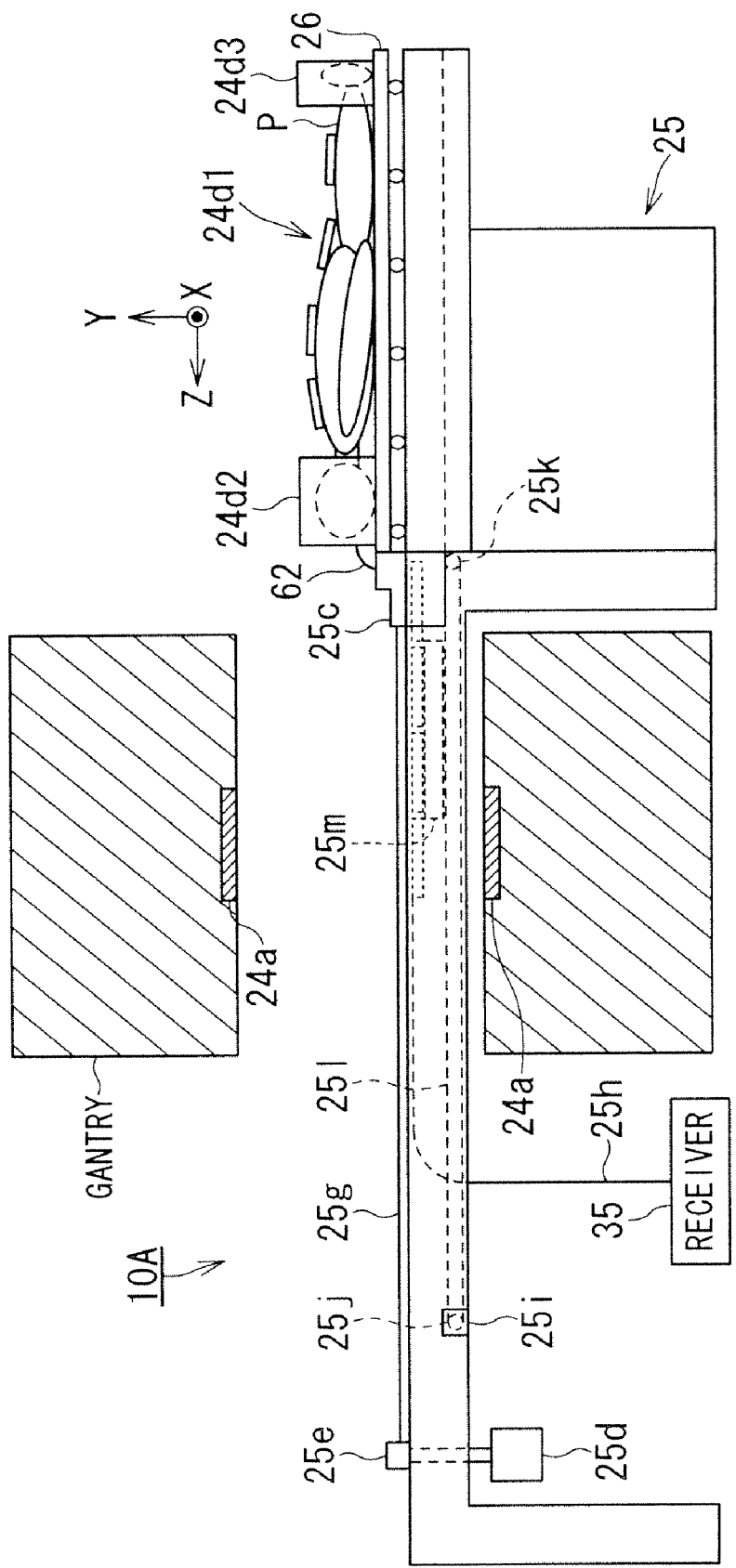
FIG. 28 is a diagram for explaining the attachment of the RF coil in the preparation for the imaging operation.

FIG. 28 is a diagram for explaining the attachment of the RF coil 24 in the preparation for the imaging operation.

As described with reference to FIG. 27, when the table-top 26 has been elevated such that the height thereof reaches a predetermined position in the relationship thereof with the trolley 25c, the sequence controller 36 controls the bed structure 25 to stop the elevation of the table-top 26. Then, the table-top 26 is mechanically coupled to the trolley 25c. In the above process, the coupling by the coupling mechanism, such as a hook, provided to at least one of the table-top 26 and the trolley 25c may be automatically performed at the same time as the completion of the elevation of the table-top 26. Alternatively, the coupling by the coupling mechanism may be manually performed after the completion of the elevation of the table-top 26.

Further, if necessary, the operator attaches the local site imaging coil 24d, which is a reception RF coil, to the patient P placed on the table-top 26. For example, to the body surface of the patient P placed on the table-top 26, the operator places the body coil 24d1, which is a local site imaging coil 24d. Further, for example, to the head of the patient P placed on the table-top 26, the operator attaches the head coil 24d2, which is a local site imaging coil 24d having a chassis substantially fitting the outer shape of the head. Furthermore, for example, to a foot of the patient P placed on the table-top 26, the operator attaches the foot coil 24d3, which is a local site imaging coil 24d having a chassis substantially fitting the outer shape of the foot. A jaw coil, a knee coil, or the like may be attached to the patient P as the local site imaging coil 24d.

Then, the operator electrically connects a cable (not illustrated) of the body coil 24d1, the cable 62 of the head coil 24d2, and the cable (not illustrated) of the foot coil 24d3 to respective connectors (not illustrated) provided to the trolley 25c.

In the above process, the cable connection to the lower coil 24c is unnecessary. Thus, there is an advantage in that the number of connected cables is smaller than in the coil system in which the lower coil 24c is previously disposed under the table-top 26.

Then, the MRI apparatus 10A performs prescanning to determine the position of each of the body coil elements $24d1\text{-}n$ included in the body coil 24d1 as described below, since the position of the body coil element on the table-top 26 is uncertain. The MRI apparatus 10A may further identify the positions of the head coil 24d2 and the foot coil 24d3. The position described below can be determined only on the RF coil 24 whose position on the table-top 26 is uncertain.

Figure 29:
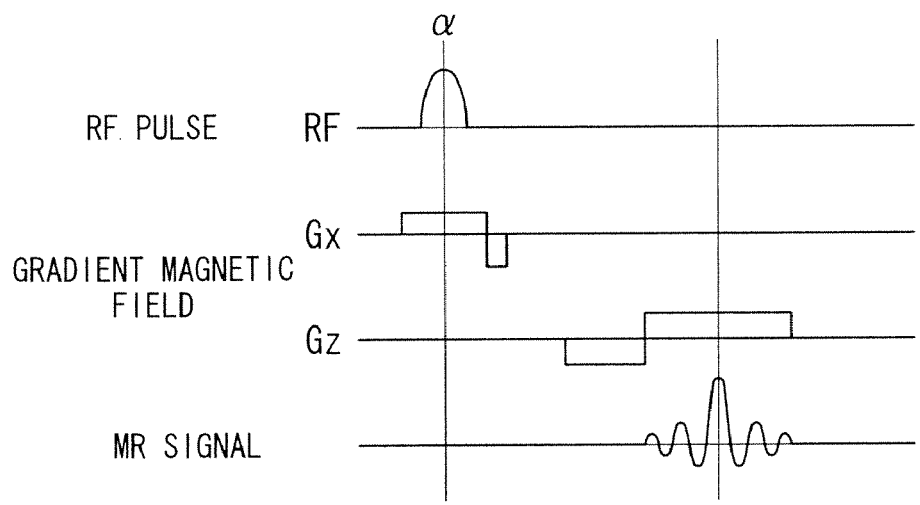
FIG. 29 is a diagram showing a basic pulse sequence in a prescanning to determine of a position.
Figure 30:
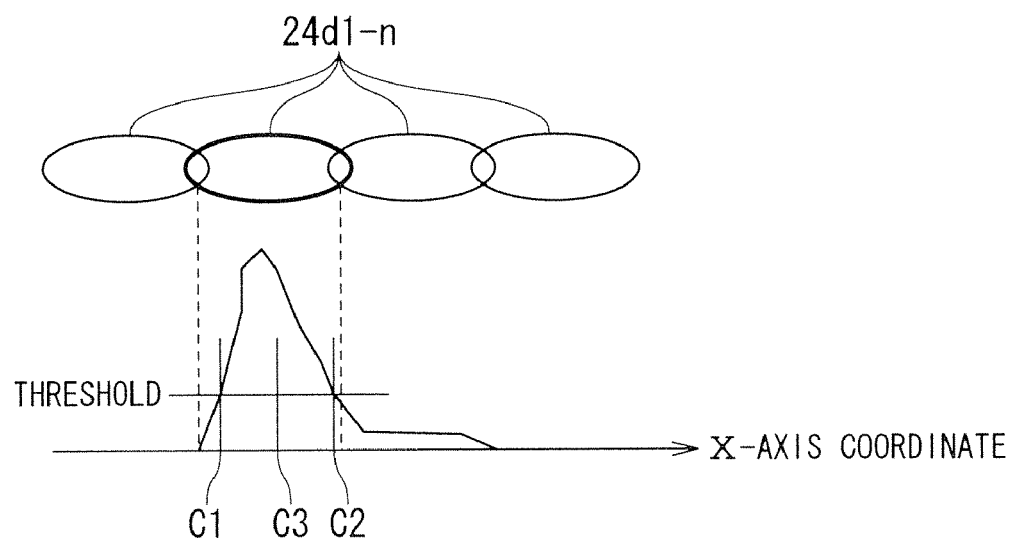
FIG. 30 is a diagram showing a principle to estimate a central coordinate of a body coil element from projection data.

Firstly, in accordance with the predetermined sequence stored in the sequence controller 36, the sequence controller 36 obtains projection data in the direction of the Z-axis, while generating a gradient magnetic field in the arrangement direction of the body coil elements $24d1\text{-}n$, i.e., in the direction of the Z-axis in accordance with the sequence illustrated in FIG. 29. In such a case, the projection data obtained on the basis of the NMR signal received by the body coil elements $24d1\text{-}n$ located within the FOV represents rough positions of the body coil elements $24d1\text{-}n$, as illustrated in FIG. 30, for example. Then, the CPU 51 (illustrated in FIG. 1) calculates coordinates C1 and C2 of both ends of each of the body coil elements $24d1\text{-}n$ on the basis of a preset threshold value, for example, and estimates that coordinates C3 forming the midpoint of the coordinates C1 and C2 of the both ends represent the central coordinates of the body coil element $24d1\text{-}n$.

None or a very small amount of the NMR signal is output from a body coil element $24d1\text{-}n$ located outside the FOV. Therefore, the CPU 51 ignores the NMR signal of the very small amount, and estimates the position only on a body coil element $24d1\text{-}n$ which has output a meaningful signal. In ignoring the signal output from the body coil element $24d1\text{-}n$, the generation of the projection data based on the signal may not be performed. Alternatively, the central coordinates based on the projection data generated from the signal may not be estimated. Still alternatively, the central coordinates estimated for the body coil element $24d1$-$n$ which has output the signal may not be used for the estimation of the positions of the respective body coil elements $24d1$-$n$. The position does not need to be estimated on all of the body coil elements $24d1$-$n$ which have output the meaningful signal. Thus, the position may be estimated only on a part of the body coil elements $24d1$-$n$.

FIG. 30 is a diagram illustrating an example of the projection data obtained for each of four body coil elements $24d1$-$n$. The actual interval between the centers of the four body coil elements $24d1$-$n$ is assumed to be 120 mm.

FIG. 30 shows the projection data obtained from a healthy person of an average physical size, as the patient P, through sagittal imaging (projection in the horizontal direction) in the range of 50 cm in thickness (substantially nonselective excitation) and with the use of the pulse sequence shown in FIG. 29. In the collection of the data, it is preferable to collect the data by oversampling in the readout direction to prevent wrap-around effects.

Figure 31:
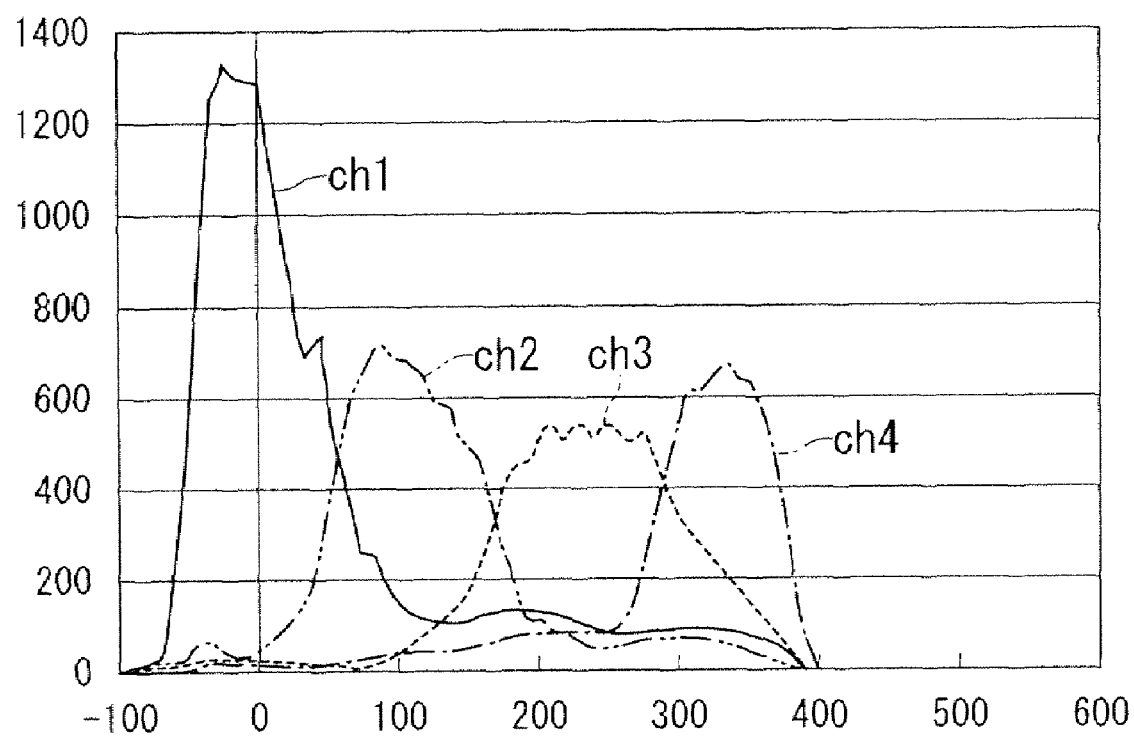
FIG. 31 is a diagram showing an example of projection data obtained about each of four body coil elements including a body coil.

The central coordinates of the four respective body coil elements $24d1$-$n$ estimated as described above on the basis of the projection data shown in FIG. 30 are 0 mm, 109 mm, 239 mm, and 331 mm, as illustrated in FIG. 31, with the central coordinates of a first channel ch1 set as the reference coordinates. In the present example, the center in the area of each of the peaks of the projection data subjected to threshold processing is determined as the estimated value of the central coordinates of the corresponding body coil element $24d1$-$n$. In the present example, the above-described threshold processing is performed with the half-value width of the peak of the projection data.

The intervals between adjacent ones of the body coil elements $24d1$-$n$ based on the above estimated values are 109 mm, 130 mm, and 92 mm, and thus do not match the known information of 120 mm. That is, the central positions estimated as described above are not the correctly estimated positions of the respective body coil elements $24d1$-$n$. In light of the above, the CPU 51 uses the coordinates (170 mm), which is calculated as the average value of the four sets of central coordinates, as the reference coordinates, and determines the central coordinates of each of the four body coil elements $24d1$-$n$ by following equations on the basis of the known information that the interval between the centers of the body coil elements $24d1$-$n$ is 120 mm.

First channel ch1: 170−120*1.5=−10 mm
Second channel ch2: 170−120*0.5=110 mm
Third channel ch3: 170+120*0.5=−230 mm
Fourth channel ch4: 170+120*1.5=350 mm In the above-described manner, on the basis of the relative relationship of the central coordinates estimated for the respective body coil elements $24d1$-$n$ and the known interval between the centers of the body coil elements $24d1$-$n$, the respective positions of the body coil elements $24d1$-$n$ are determined. Accordingly, the positions of the body coil elements $24d1$-$n$ can be determined with higher accuracy. That is, robust estimation can be performed, as compared with a method in which the positions of the respective body coil elements $24d1$-$n$ are individually obtained.

Figure 32:
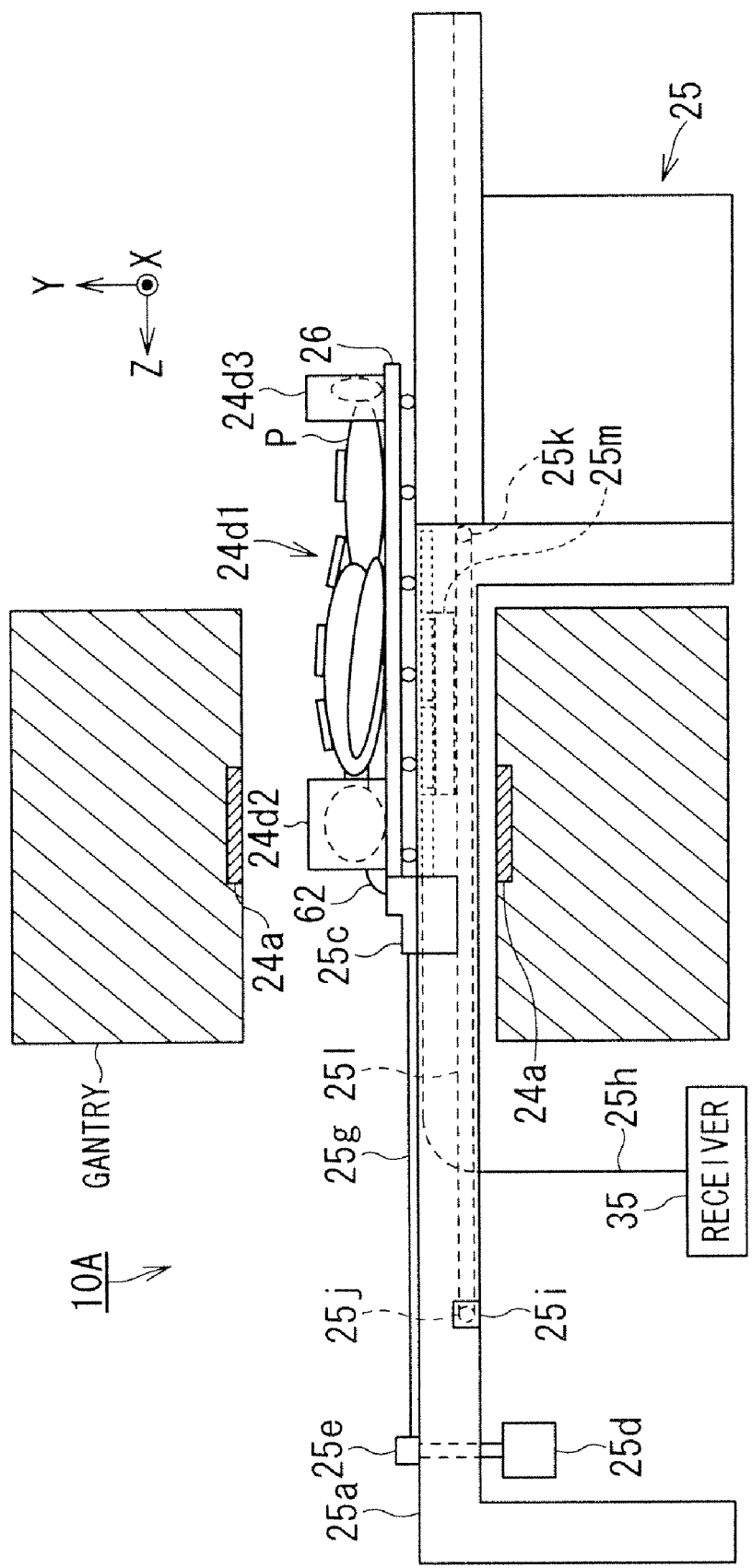
FIG. 32 is a diagram for explaining the imaging of the head.

FIG. 32 is a diagram for explaining the imaging of the head.

In accordance with the predetermined sequence stored in the sequence controller 36, the sequence controller 36 drives the motor $25d$ to draw the trolley $25c$ toward the drive pulley $25e$ through the timing belt $25g$. That is, the table-top 26 is moved from the position illustrated in FIG. 28 to a head imaging position. Then, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the head coil $24d2$ via the received signal cable $25h$, the imaging of the head of the patient P is performed.

An image obtained by the imaging of the head is stored in the storage device, such as the HD 53 (illustrated in FIG. 1) of the computer 37, displayed on the display device 56 (illustrated in FIG. 1), or transmitted to the network N (illustrated in FIG. 1) via the IF 54 (illustrated in FIG. 1).

The MRI apparatus 10A may be configured such that, during the imaging by the head coil $24d2$, the lower coil $24c$ is moved in the direction of the Z-axis to be retreated to a position outside the FOV in the gantry. In such a configuration, the head coil $24d2$ and the lower coil $24c$ can be prevented from being electromagnetically coupled with each other during the imaging of the head.

Figure 33:
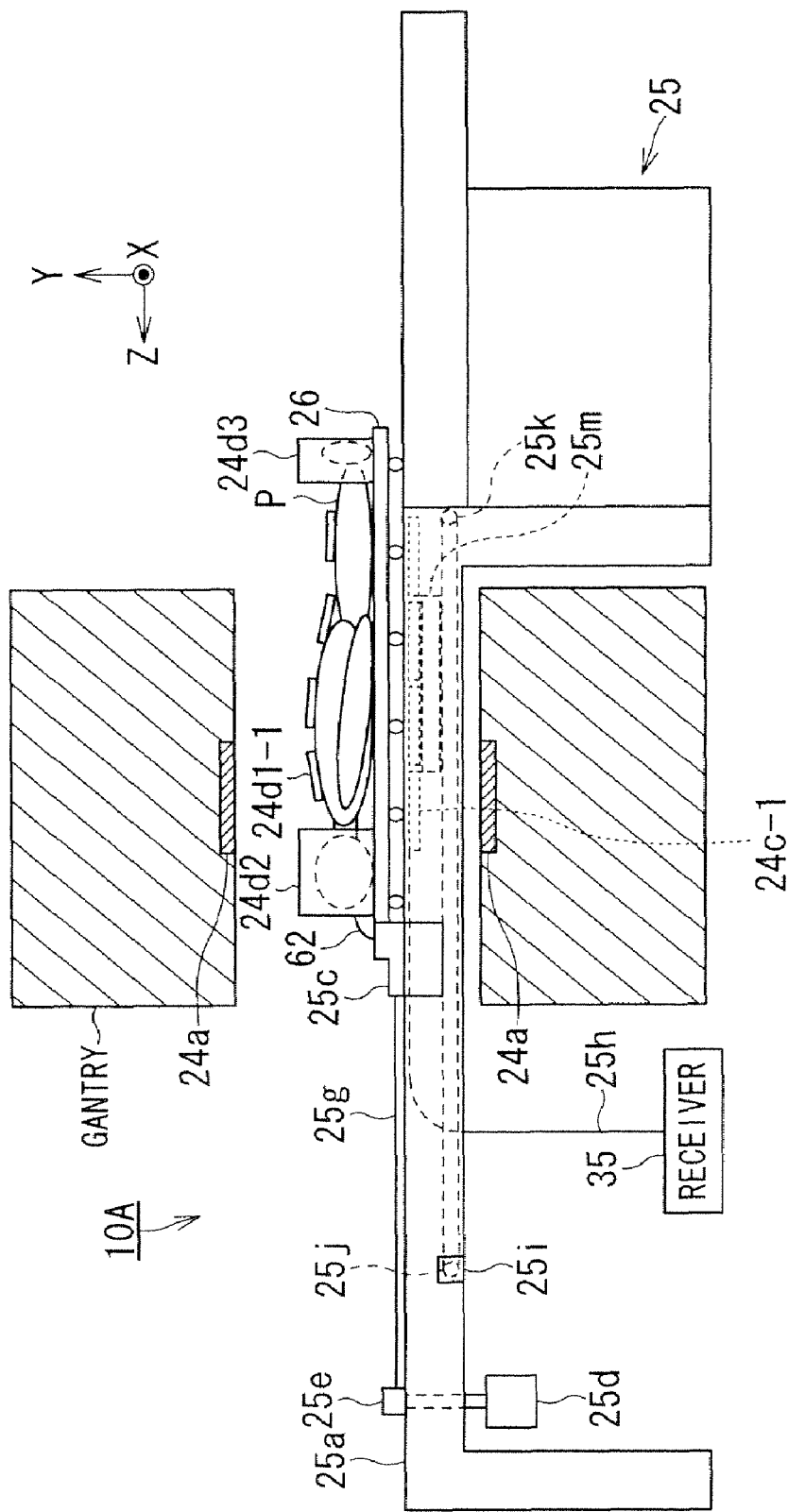
FIG. 33 is a diagram for explaining the imaging of the neck.

FIG. 33 is a diagram for explaining the imaging of the neck.

After the imaging of the head, the sequence controller 36 drives the motor $25d$ in accordance with the stored predetermined sequence to draw the trolley $25c$ toward the drive pulley $25e$ through the timing belt $25g$. That is, the table-top 26 is moved from the head imaging position illustrated in FIG. 32 to a neck imaging position.

Further, in accordance with the position of the body coil element $24d1$-1 determined by the prescanning, the sequence controller 36 drives the motors $25i$ to move the lower coil $24c$ in the horizontal direction through the coil base unit $25m$. In the above process, the lower coil $24c$ is moved in the horizontal direction such that the position of the lower coil element $24c$-1 corresponds to the position of the body coil element $24d1$-1 determined by the prescanning.

Then, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the body coil element $24d1$-1 and the lower coil element $24c$-1 via the received signal cable $25h$, the imaging of the neck of the, patient P is performed.

An image obtained by the imaging of the neck is stored in the storage device, such as the HD 53 of the computer 37, displayed on the display device 56, or transmitted to the network N via the IF 54.

Figure 34:
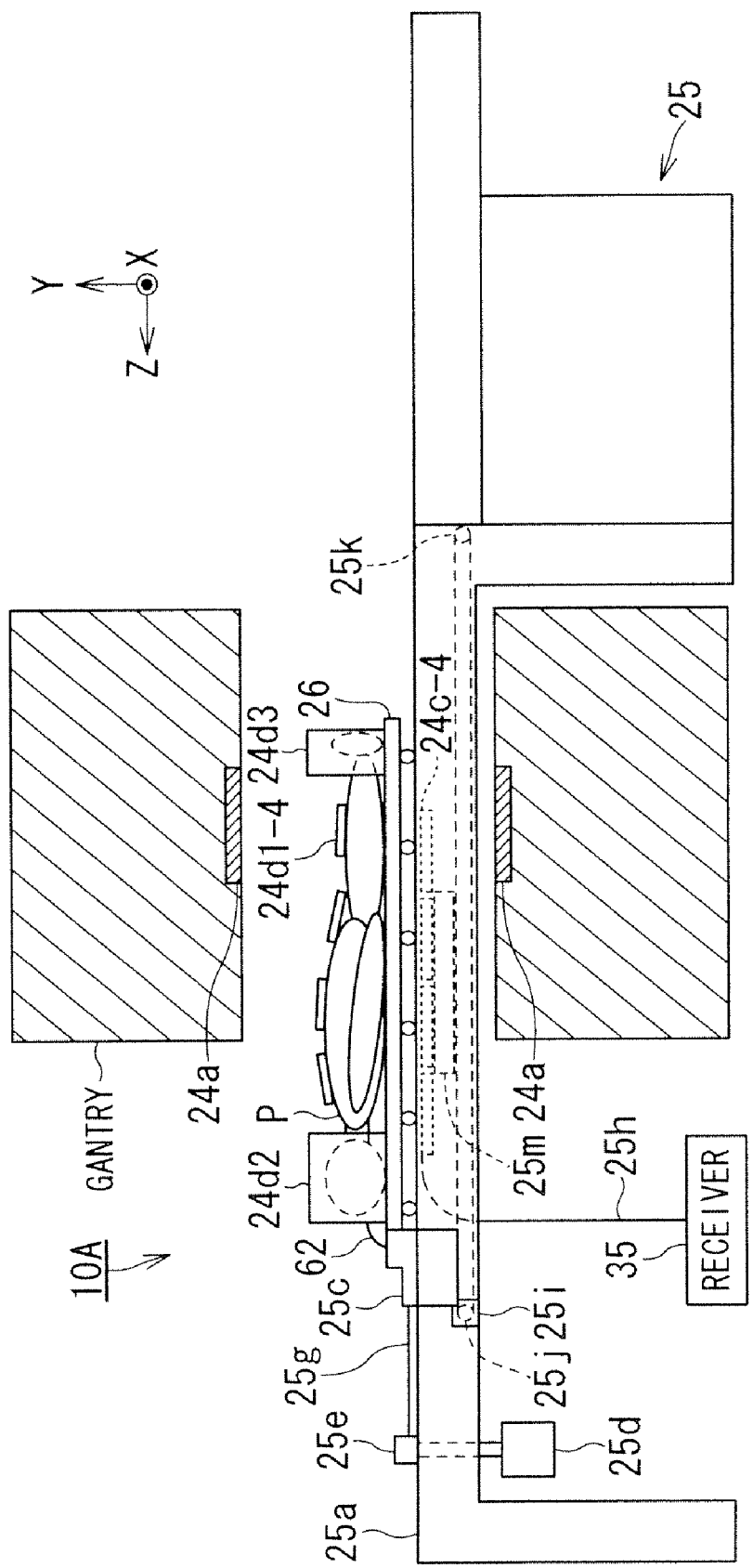
FIG. 34 is a diagram for explaining the imaging of the leg.

FIG. 34 is a diagram for explaining the imaging of the leg.

After the imaging of the neck, in accordance with the stored predetermined sequence, the sequence controller 36 drives the motor $25d$ to draw the trolley $25c$ toward the drive pulley $25e$ through the timing belt $25g$. That is, the table-top 26 is moved from the neck imaging position illustrated in FIG. 33 to a leg imaging position.

Further, in accordance with the position of the body coil element $24d1$-4 determined by the prescanning, the sequence controller 36 drives the motors $25i$ to move the lower coil $24c$ in the horizontal direction through the coil base unit $25m$. In the above process, the lower coil $24c$ is moved in the horizontal direction such that the position of the lower coil element $24c$-4 corresponds to the position of the body coil element $24d1$-4 determined by the prescanning.

Then, in accordance with the stored predetermined sequence, the sequence controller 36 drives the gradient magnetic field power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the body coil element 24d1-4 and the lower coil element 24c-4 via the received signal cable 25h, the imaging of a leg of the patient P is performed. Sequential imaging of regions from the neck to the leg can be also performed by using the body coil 24d1 and the lower coil elements 24c-2 and 24c-3.

An image obtained by the imaging of the leg is stored in the storage device, such as the HD 53 of the computer 37, displayed on the display device 56, or transmitted to the network N via the IF 54.

Figure 35:
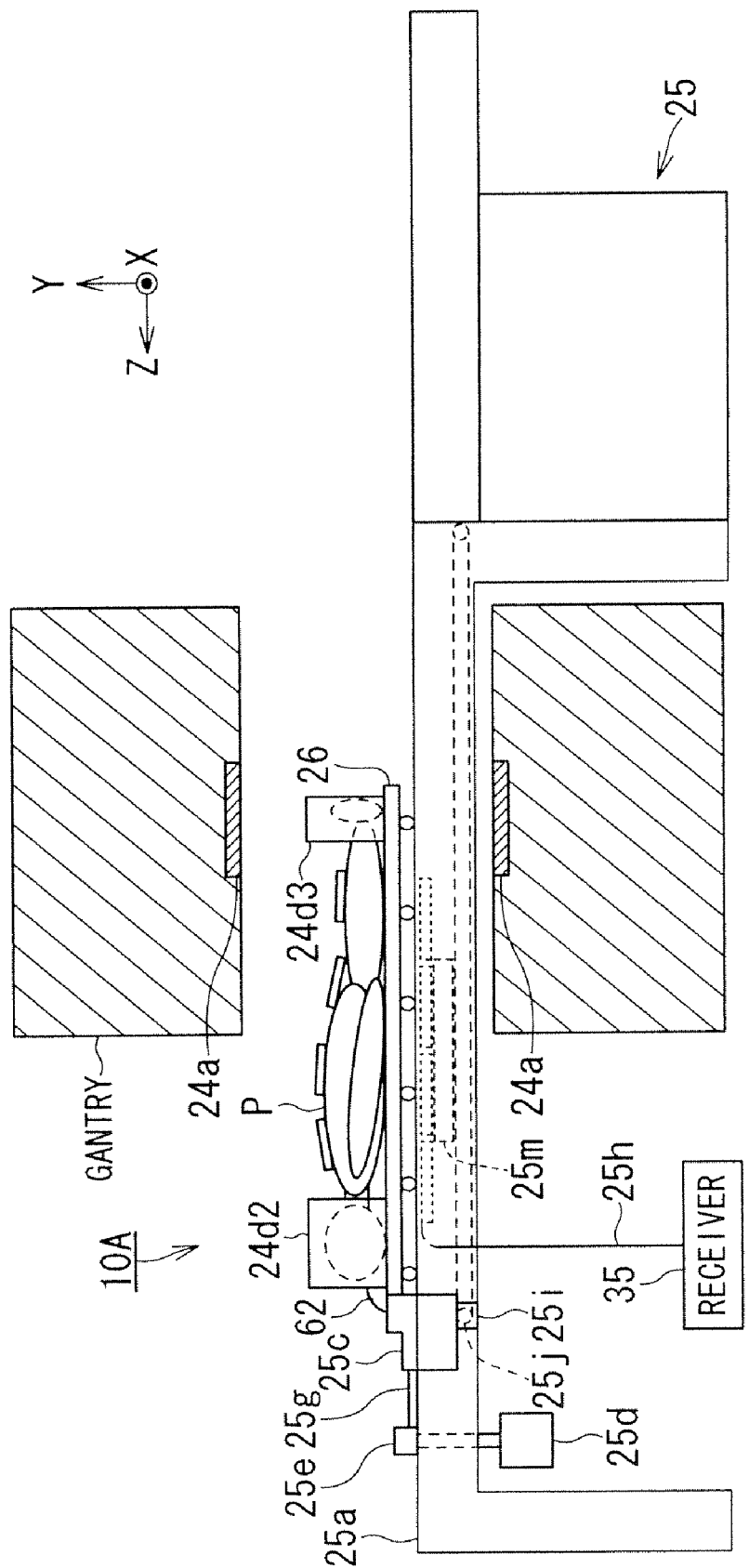
FIG. 35 is a diagram for explaining the imaging of the foot.
Figure 36:
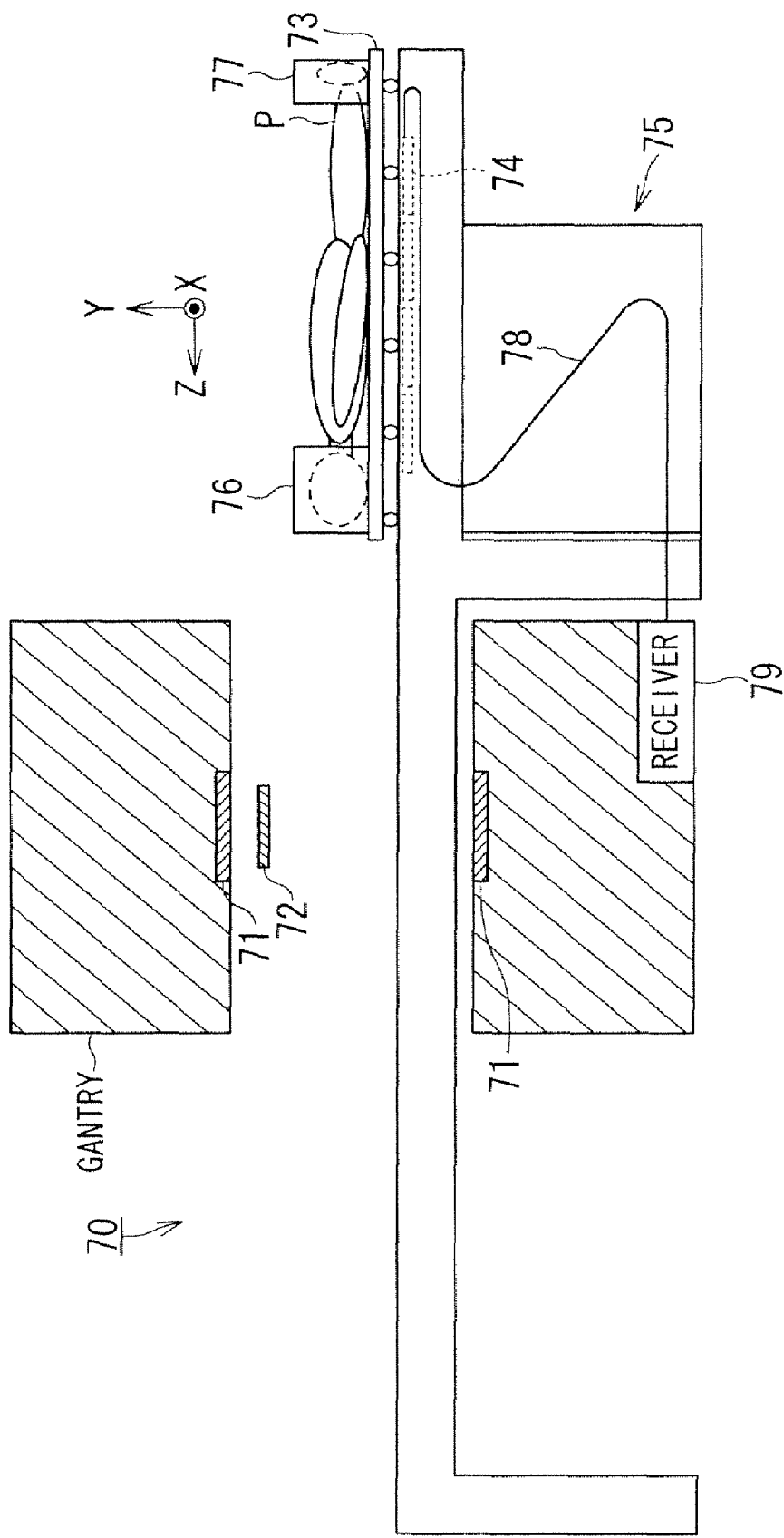
FIG. 36 is a diagram illustrating a configuration of a conventional MRI apparatus.

FIG. 35 is a diagram for explaining the imaging of the foot.

After the imaging of the leg, in accordance with the stored predetermined sequence, the sequence controller 36 drives the motor 25d to draw the trolley 25c toward the drive pulley 25e through the timing belt 25g. That is, the table-top 26 is moved from the leg imaging position illustrated in FIG. 34 to a foot imaging position. Then, in accordance with the stored predetermined sequence, the sequence controller 36 drives the gradient magnetic power supply 32, the transmitter 34, and the receiver 35 to generate the X-axis gradient magnetic field Gx, the Y-axis gradient magnetic field Gy, the Z-axis gradient magnetic field Gz, and the RF signal. On the basis of the NMR signal received by the receiver 35 from the foot coil 24d3 via the received signal cable 25h, the imaging of a foot of the patient P is performed.

An image obtained by the imaging of the foot is stored in the storage device, such as the HD 53 of the computer 37, displayed on the display device 56, or transmitted to the network N via the IF 54.

The MRI apparatus 10A may be configured such that, during the imaging by the foot coil 24d3, the lower coil 24c is moved in the direction of the Z-axis to be retreated to a position outside the FOV in the gantry. In such a configuration, the foot coil 24d3 and the lower coil 24c can be prevented from being electromagnetically coupled with each other during the imaging of the foot.

After the completion of the imaging of the foot, the sequence controller 36 drives the motor 25d in accordance with the stored predetermined sequence to withdraw the trolley 25c from the drive pulley 25e through the timing belt 25g. The table-top 26 connected to and integrated with the trolley 25c is moved to the position illustrated in FIG. 33.

Then, in accordance with the stored predetermined sequence, the sequence controller 36 drives the motor 25d to withdraw the trolley 25c from the drive pulley 25e through the timing belt 25g. The trolley 25c is moved to the position illustrated in FIG. 28, and the coupling between the table-top 26 and the trolley 25c is released. In the above process, the coupling between the table-top 26 and the trolley 25c may be automatically released at the same time as the arrival of the table-top 26 at the position illustrated in FIG. 28. Alternatively, the coupling may be manually released after the arrival of the table-top 26 at the position illustrated in FIG. 28.

Then, the operator releases the electrical connection between the trolley 25c and the cable (not illustrated) of the body coil 24d1 placed on the body surface of the patient P, and detaches the body coil 24d1 from the patient P. Further, the operator releases the electrical connection between the trolley 25c and the cable 62 of the head coil 24d2 attached to the head of the patient P, and detaches the head coil 24d2 from the patient P. Furthermore, the operator releases the electrical connection between the trolley 25c and the cable (not illustrated) of the foot coil 24d3 attached to the foot of the patient P, and detaches the foot coil 24d3 from the patient P.

Then, the operator performs an operation of lowering the table-top 26, on which the patient P is placed, with the use of the input device 55. Thereby, the sequence controller 36 controls the bed structure 25 to lower the table-top 26. With the use of the table-top rollers 26a, the operator transfers the table-top 26, on which the patient P is placed, onto the stretcher 61.

According to the MRI apparatus 10A of the second embodiment, the length of the cable connected to the lower coil 24c can be reduced. Accordingly, a good image having no deterioration in the S/N ratio can be obtained.

Further, according to the MRI apparatus 10A of the second embodiment, the lower coil 24c can be retreated to the rear side of the gantry. Accordingly, a factor deteriorating the coil performance is eliminated, and a good image can be obtained.

Furthermore, according to the MRI apparatus 10A of the second embodiment, the lower coil 24c can be freely selected with respect to the body coil 24d1 (the upper coil 24b) and can be moved in the width direction of the table-top 26. Accordingly, a good image can be obtained with the most suitable coil with no concern for the positioning (e.g., the position and the physical size) of the patient.

In addition, according to the MRI apparatus 10A of the second embodiment, only the table-top 26 is transferred. Accordingly, an extra lower coil 24c is unnecessary, and the transfer of the patient P to and from the stretcher 61 can be performed inexpensively and smoothly.

What is claimed is:

1. A magnetic resonance imaging apparatus comprising:
a static field magnet;
gradient coils;
a gantry including an opening and storing the static field magnet the gradient coils;
a bed structure for advancing and retreating a table-top, on which an object can be placed, with respect to the opening;
a lower coil formed by a radio frequency coil disposed below the table-top; and
a movement control unit configured to control the lower coil to be movable.

2. A magnetic resonance imaging apparatus according to claim 1, further comprising an upper coil, formed by the radio frequency coil, stored in the gantry and provided at a position in an imaging center of the gantry facing the lower coil across the object.

3. A magnetic resonance imaging apparatus according to claim 1, wherein the radio frequency coil is at least one of a body coil, a head coil and a foot coil as a local site imaging coil.

4. A magnetic resonance imaging apparatus according to claim 3, wherein a position of a coil element constituting the local site imaging coil is estimated, in accordance with the position, the lower coil moves in a width direction and a longer direction of the table-top.

5. A magnetic resonance imaging apparatus according to claim 3, wherein during the imaging by the local site imaging coil, the lower coil retreat to a position outside a field of view in the opening.

6. A magnetic resonance imaging apparatus according to claim 1, wherein the movement control unit controls the lower coil to be movable in a width direction of the table-top.

7. A magnetic resonance imaging apparatus according to claim 1, wherein the movement control unit is a coil carriage that controls the lower coil to be movable in the opening.

8. A magnetic resonance imaging apparatus according to claim 7, further comprising a power collector be connectable the table-top and the coil carriage, and be movable in a longer direction of the table-top.

9. A magnetic resonance imaging apparatus according to claim 8, further comprising a plurality of holes provided with the coil carriage in the longer direction, a plurality of hooks, which engage with the holes, provided with the power collector, wherein an engaging position of the holes and the hooks is changed to change a relative positional relationship between the lower coil and the power collector.

10. A magnetic resonance imaging apparatus according to claim 8, wherein a relative positional relationship between the lower coil and the power collector changes by a braking mechanism using a friction of the coil carriage.

* * * * *